(12) United States Patent
Kadota et al.

(10) Patent No.: US 7,425,788 B2
(45) Date of Patent: Sep. 16, 2008

(54) SURFACE ACOUSTIC WAVE DEVICE

(75) Inventors: Michio Kadota, Kyoto (JP); Tetsuya Kimura, Omihachiman (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 11/627,537

(22) Filed: Jan. 26, 2007

(65) Prior Publication Data

US 2007/0120439 A1    May 31, 2007

Related U.S. Application Data

(63) Continuation of application No. PCT/JP2005/013462, filed on Jul. 22, 2005.

(30) Foreign Application Priority Data

Jul. 26, 2004  (JP)  ............................... 2004-217360
Jan. 26, 2005  (JP)  ............................... 2005-018894

(51) Int. Cl.
*H03H 9/145* (2006.01)
(52) U.S. Cl. .................... 310/313 B; 333/187; 333/193; 333/195
(58) Field of Classification Search .................. 310/313; 333/187–195
See application file for complete search history.

(56) References Cited

U.S. PATENT DOCUMENTS 6,737,941 B1 *  5/2004  Tournois ..................... 333/193
6,836,196 B2   12/2004  Kadota et al.
6,914,498 B2 *  7/2005  Kadota ....................... 333/195
7,109,634 B2    9/2006  Nakao et al.
2003/0155844 A1  8/2003  Anasako
2004/0145431 A1  7/2004  Nakao et al.
2004/0164644 A1  8/2004  Nishiyama et al.

FOREIGN PATENT DOCUMENTS

| JP | 52-48375 U     | 4/1977  |
|----|----------------|---------|
| JP | 06-164306 A    | 6/1994  |
| JP | 07-015274 A    | 1/1995  |
| JP | 09-083030 A    | 3/1997  |
| JP | 2003-198323 A  | 7/2003  |
| JP | 2003-243961 A  | 8/2003  |
| JP | 2003-258602 A  | 9/2003  |
| JP | 2004-112748 A  | 4/2004  |
| JP | 2004-228689 A  | 8/2004  |
| JP | 2004-254291 A  | 9/2004  |
| JP | 3841053 B2     | 11/2006 |
| WO | 01/29964 A1    | 4/2001  |

OTHER PUBLICATIONS

Official Communication for PCT Application No. PCT/JP2005/013462; mailed on Nov. 8, 2005.

* cited by examiner

*Primary Examiner*—J. A San Martin
(74) *Attorney, Agent, or Firm*—Keating & Bennett, LLP

(57) ABSTRACT

In a surface acoustic wave device, a plurality of grooves are provided on a piezoelectric substrate, an electrode film defining an IDT electrode is formed by filling an electrode material in the grooves, an insulator layer, such as a $SiO_2$ film, is arranged so as to cover the piezoelectric substrate and the electrode film formed in the grooves, and the surface of the insulator layer is flattened.

24 Claims, 28 Drawing Sheets

SiO2/Al/LT SiO2=0.25

SiO2/Al/LT SiO2=0.35

FIG.19    49a

SURFACE ACOUSTIC WAVE DEVICE

BACKGROUND OF THE INVENTION

1. Field of the Invention

The present invention relates to surface acoustic wave devices used for, for example, resonators, and bandpass filters, and more particularly, to a surface acoustic wave device including an insulator layer that is arranged so as to cover an IDT electrode and the manufacturing method therefor.

2. Description of the Related Art

Duplexers (DPX) and RF filters used in mobile communication systems must have broadband characteristics and good temperature characteristics. In a surface acoustic wave device conventionally used for DPXs or RF filters, a piezoelectric substrate made of 36° to 50° rotation-Y plate X propagation $LiTaO_3$ is used. The frequency temperature coefficient of the piezoelectric substrate is in the range of −45 ppm/° C. to −35 ppm/° C. In order to improve temperature characteristics, a method of forming a $SiO_2$ film having a positive frequency temperature coefficient so as to cover an IDT electrode on the piezoelectric substrate is known.

However, in a structure in which a $SiO_2$ film is formed so as to cover an IDT electrode, a step is produced between a portion in which the finger electrode of the IDT electrode is disposed and a portion in which the IDT electrode is not disposed. In other words, a difference in the height of the surface of the $SiO_2$ film between a portion in which the IDT electrode is disposed and a portion in which no IDT electrode is disposed, has to be present. Consequently, there has been a problem in that insertion loss degrades due to unevenness of the surface of the above-mentioned $SiO_2$ film.

Moreover, as the film thickness of the IDT electrode increases, the above-mentioned unevenness also increases. Accordingly, the film thickness of the IDT electrode cannot be substantially increased.

As a method for solving such problems, in Japanese Patent Laid Open Publication No. 2004-112748 (Patent Document 1), a method is disclosed in which a $SiO_2$ film is formed so as to cover the IDT electrode and a first insulator layer after the first insulator layer, which has a film thickness approximately equal to that of the electrode, is formed between electrode-fingers of the IDT electrode. Here, since the substrate is substantially flat, the surface of the $SiO_2$ film is flattened. In a surface acoustic wave device described in Patent Document 1, the above-mentioned IDT electrode includes a lamination film composed of a metal having density greater than that of Al, or an alloy primarily composed of the metal, and another metal, and the density of the electrode is at least about 1.5 times that of the first insulator layer.

On the other hand, in Japanese Patent Laid Open Publication No. 09-83030 (Patent Document 2), a surface acoustic wave device is disclosed, a groove is formed in one side of a $LiTaO_3$ substrate or a $LiNbO_3$ substrate, and an IDT electrode is formed by filling the groove with Al.

However, in the surface acoustic wave device described in Patent Document 1, since an electrode having a density greater than Al is used, the fluctuations of acoustic velocities and frequencies due to the fluctuations in the electrode thickness are relatively large, while it has been shown that, when an electrode formed of Al is provided, the reflection coefficient of the electrode is relatively low. As a result, sufficient characteristics for a surface acoustic wave resonator or a surface acoustic wave filter cannot be obtained.

In the surface acoustic wave device described in Patent Document 2, the electrode is formed by filling Al in the groove formed in the $LiTaO_3$ substrate or the $LiNbO_3$ substrate. Therefore, when a material layer is laminated on the substrate so as to cover the electrode, the surface of the material layer is flattened. However, when a surface acoustic wave filter is configured with a surface acoustic wave resonator, sufficient characteristics cannot be obtained.

SUMMARY OF THE INVENTION

To overcome the problems described above, preferred embodiments of the present invention provide a surface acoustic wave device in which an insulator layer composed of $SiO_2$ or other suitable material is arranged so as to cover an IDT electrode and the surface of the $SiO_2$ film is flattened. As a result of this unique structure, the insertion loss is sufficiently small, and even when the electrode is formed with Al or other low density material, the reflection coefficient is sufficiently large, thus, obtaining good resonance characteristics and filter characteristics.

According to a first preferred embodiment of the present invention, a surface acoustic wave device includes a $LiTaO_3$ substrate having a plurality of grooves in the upper surface thereof, an IDT electrode defined by Al disposed in the grooves, and a $SiO_2$ layer arranged so as to cover the $LiTaO_3$ substrate and the IDT electrode, in which, the upper surface of the $SiO_2$ layer is flattened, using λ as the wavelength of a surface acoustic wave, the Euler angle of the $LiTaO_3$ substrate is within any one of the ranges provided in Table 1 shown below, the film thickness of the IDT is within the range shown at a location at which the Euler angle of the $LiTaO_3$ substrate corresponds to any one of those provided in Table 1, and the film thickness of the $SiO_2$ layer is within the range indicated at a location at which the film thickness of the IDT electrode corresponds to that of Al provided in Table 1.

In addition, in subsequent notations, H denotes the film thickness. Moreover, a normalized film thickness denotes the value of the film thickness H divided by the wavelength λ of

TABLE 1

| | α = 0.05 or less<br>θ of Euler angle (0, θ, 0) |
|---|---|
| 0.125 <= $SiO_2$ layer thickness <= 0.20 | |
| 0.02 <= Al thickness < 0.04 | (0, 114° to 142°, 0) |
| 0.04 <= Al thickness < 0.06 | (0, 115° to 143°, 0) |
| 0.06 <= Al thickness < 0.1 | (0, 113° to 145°, 0) |
| 0.1 <= Al thickness < 0.14 | (0, 112° to 146°, 0) |
| 0.20 <= $SiO_2$ layer thickness <= 0.275 | |
| 0.02 <= Al thickness < 0.04 | (0, 113° to 140°, 0) |
| 0.04 <= Al thickness < 0.06 | (0, 113° to 140°, 0) |
| 0.06 <= Al thickness < 0.1 | (0, 111° to 140°, 0) |
| 0.1 <= Al thickness < 0.14 | (0, 111° to 140°, 0) |
| 0.275 <= $SiO_2$ layer thickness <= 0.35 | |
| 0.02 <= Al thickness < 0.04 | (0, 111° to 137°, 0) |
| 0.04 <= Al thickness < 0.06 | (0, 111° to 137°, 0) |
| 0.06 <= Al thickness < 0.1 | (0, 109° to 136°, 0) |
| 0.1 <= Al thickness < 0.14 | (0, 107° to 136°, 0) |

$SiO_2$ layer thickness and Al thickness are each normalized film thickness H/λ.

The Euler angle of the $LiTaO_3$ substrate is preferably within any one of the ranges provided in Table 2 shown below, the film thickness of the IDT electrode is within the range indicated at a location at which the Euler angle of the $LiTaO_3$ substrate corresponds to any one of those provided in Table 2, and the film thickness of the $SiO_2$ layer is within the range indicated at a location at which the film thickness of the IDT electrode corresponds to that of Al provided in Table 2.

TABLE 2

| | α = 0.025 or less<br>θ of Euler angle (0, θ, 0) |
|---|---|
| 0.125 <= SiO₂ layer thickness <= 0.20 | |
| 0.02 <= Al thickness < 0.04 | (0, 118° to 137°, 0) |
| 0.04 <= Al thickness < 0.06 | (0, 117° to 139°, 0) |
| 0.06 <= Al thickness < 0.1 | (0, 117° to 141°, 0) |
| 0.1 <= Al thickness < 0.14 | (0, 116° to 141°, 0) |
| 0.20 <= SiO₂ layer thickness <= 0.275 | |
| 0.02 <= Al thickness < 0.04 | (0, 115° to 137°, 0) |
| 0.04 <= Al thickness < 0.06 | (0, 115° to 138°, 0) |
| 0.06 <= Al thickness < 0.1 | (0, 115° to 138°, 0) |
| 0.1 <= Al thickness < 0.14 | (0, 114° to 136°, 0) |
| 0.275 <= SiO₂ layer thickness <= 0.35 | |
| 0.02 <= Al thickness < 0.04 | (0, 113° to 137°, 0) |
| 0.04 <= Al thickness < 0.06 | (0, 113° to 137°, 0) |
| 0.06 <= Al thickness < 0.1 | (0, 111° to 136°, 0) |
| 0.1 <= Al thickness < 0.14 | (0, 112° to 133°, 0) |

SiO₂ layer thickness and Al thickness are each normalized film thickness H/λ.

According to a second preferred embodiment of the present invention, a surface acoustic wave device includes a LiTaO₃ substrate having a plurality of grooves in the upper surface thereof, an IDT electrode defined by Al filled in the grooves, and a SiO₂ layer arranged so as to cover the LiTaO₃ substrate and the IDT electrode, in which, the upper surface of the SiO₂ layer is flattened, using λ as the wavelength of a surface acoustic wave, the Euler angle of the LiTaO₃ substrate is within any one of the ranges provided in Table 3 shown below, the film thickness of the IDT is within the range indicated at a location at which the Euler angle of the LiTaO₃ substrate corresponds to any one of those provided in Table 3; and the film thickness of the SiO₂ layer is within the range indicated at a location in which the film thickness of the IDT electrode corresponds to that of Al provided in Table 3.

TABLE 3

| | α = 0.05 or less<br>θ of Euler angle (0, θ, 0) |
|---|---|
| 0.125 <= SiO₂ layer thickness <= 0.20 | |
| 0.02 <= Al thickness < 0.04 | (0, 119° to 152°, 0) |
| 0.04 <= Al thickness < 0.06 | (0, 120° to 153°, 0) |
| 0.06 <= Al thickness < 0.1 | (0, 124° to 158°, 0) |
| 0.1 <= Al thickness < 0.14 | (0, 128° to 155°, 0) |
| 0.20 <= SiO₂ layer thickness <= 0.275 | |
| 0.02 <= Al thickness < 0.04 | (0, 123° to 152°, 0) |
| 0.04 <= Al thickness < 0.06 | (0, 124.5° to 153°, 0) |
| 0.06 <= Al thickness < 0.1 | (0, 123.5° to 154°, 0) |
| 0.1 <= Al thickness < 0.14 | (0, 119° to 157°, 0) |
| 0.275 <= SiO₂ layer thickness <= 0.35 | |
| 0.02 <= Al thickness < 0.04 | (0, 124° to 150°, 0) |
| 0.04 <= Al thickness < 0.06 | (0, 124° to 146°, 0) |
| 0.06 <= Al thickness < 0.1 | (0, 114° to 149°, 0) |
| 0.1 <= Al thickness < 0.14 | (0, 103° to 148°, 0) |

SiO₂ layer thickness and Al thickness are each normalized film thickness H/λ.

The Euler angle of the LiTaO₃ substrate is preferably within any one of the ranges provided in Table 2 shown below, the film thickness of the IDT electrode is within the range indicated at a location in which the Euler angle of the LiTaO₃ substrate corresponds to any one of those provided in Table 4, and the film thickness of the SiO₂ layer is within the range indicated at a location in which the film thickness of the IDT electrode corresponds to that of Al provided in Table 4.

TABLE 4

| | α = 0.25 or less<br>θ of Euler angle (0, θ, 0) |
|---|---|
| 0.125 <= SiO₂ layer thickness <= 0.20 | |
| 0.02 <= Al thickness < 0.04 | (0, 123° to 148°, 0) |
| 0.04 <= Al thickness < 0.06 | (0, 127° to 149°, 0) |
| 0.06 <= Al thickness < 0.1 | (0, 127.5° to 154°, 0) |
| 0.1 <= Al thickness < 0.14 | (0, 132° to 158°, 0) |
| 0.20 <= SiO₂ layer thickness <= 0.275 | |
| 0.02 <= Al thickness < 0.04 | (0, 127° to 148°, 0) |
| 0.04 <= Al thickness < 0.06 | (0, 128° to 149°, 0) |
| 0.06 <= Al thickness < 0.1 | (0, 128° to 149°, 0) |
| 0.1 <= Al thickness < 0.14 | (0, 124° to 155°, 0) |
| 0.275 <= SiO₂ layer thickness <= 0.35 | |
| 0.02 <= Al thickness < 0.04 | (0, 128° to 146°, 0) |
| 0.04 <= Al thickness < 0.06 | (0, 128° to 146°, 0) |
| 0.06 <= Al thickness < 0.1 | (0, 119° to 146°, 0) |
| 0.1 <= Al thickness < 0.14 | (0, 110° to 145°, 0) |

SiO₂ layer thickness and Al thickness are each normalized film thickness H/λ.

The Euler angle of the LiTaO₃ substrate preferably satisfies the Euler angles provided in Tables 1 and 3 mentioned-above.

Moreover, more preferably, the Euler angle satisfies the Euler angles provided in Tables 1 and 4 mentioned-above.

The Euler angle of the LiTaO₃ substrate preferably satisfies the Euler angles provided in Tables 2 and 3 mentioned-above, more preferably, the Euler angle satisfies the Euler angles provided in Tables 2 and 4 mentioned-above.

The upper surface of the IDT electrode is preferably configured to be flush with the LiTaO₃ substrate.

Each of the grooves is preferably surrounded by a pair of inner side surfaces extending between the inner bottom surface thereof and the upper surface of the LiTaO₃ substrate, and the internal angles of the grooves between the inner surfaces and the upper surface of the piezoelectric substrate are preferably in the range of about 45° to about 90°.

According to a third preferred embodiment of the present invention, a surface acoustic wave device includes a LiNbO₃ substrate having a plurality of grooves in the upper surface thereof, an IDT electrode defined by Al filled in the grooves, and a SiO₂ layer arranged so as to cover the LiNbO₃ substrate and the IDT electrode, in which, the upper surface of the SiO₂ layer is flattened, using λ as the wavelength of a surface acoustic wave, the normalized film thickness of the IDT electrode is in the range of about 0.04 to about 0.16, the normalized film thickness of the SiO₂ layer is in the range of about 0.2 to about 0.4, and the Euler angle of the LiTaO₃ substrate is within any one of the ranges provided in Table 5 shown below.

TABLE 5

| θ of Euler angle (0°, θ, 0°) |
|---|
| (0°, 85° to 120°, 0°) |
| (0°, 125° to 141°, 0°) |
| (0°, 145° to 164°, 0°) |
| (0°, 160° to 180°, 0°) |

The Euler angle of the LiNbO₃ substrate is preferably within any one of the ranges provided in Table 6 shown below.

TABLE 6

| θ of Euler angle (0°, θ, 0°) |
|---|
| (0°, 90° to 110°, 0°) |
| (0°, 125° to 136°, 0°) |
| (0°, 149° to 159°, 0°) |
| (0°, 165° to 175°, 0°) |

The normalized film thickness of the IDT electrode is preferably in the range of about 0.06 to about 0.12.

The normalized film thickness of the SiO₂ layer is preferably in the range of about 0.25 to about 0.3.

The upper surface of the IDT electrode is preferably configured to be flush with the LiNbO₃ substrate.

Each of the grooves is preferably surrounded by a pair of inner side surfaces extending between the inner bottom surface thereof and the upper surface of the LiNbO₃ substrate, and the internal angles of the grooves between the inner surfaces and the upper surface of the piezoelectric substrate are in the range of about 45° to about 90°.

The internal angles of the grooves are preferably in the range of about 50° to about 80°.

The IDT electrode includes an electrode layer made of Al, and a close contact layer, laminated on the electrode layer made of Al, which is made of a metal or an alloy having a density that is greater than that of Al.

In the surface acoustic wave device according to the first preferred embodiment, a plurality of grooves are provided in the upper surface of a LiTaO₃ substrate, and an IDT electrode is defined by Al filed into the grooves. Accordingly, since the IDT electrode is defined by Al filled in the grooves, the upper surface of a SiO₂ layer arranged so as to cover the LiTaO₃ substrate and the IDT electrode is flattened. Thereby, degradation of insertion loss does not occur. In addition, as is clear from the specific examples described below, since the electrode is defined by Al filled in the grooves, the reflection coefficient of the IDT electrode has a sufficient magnitude. Therefore, good resonance characteristics and filter characteristics are obtained.

Moreover, while the frequency temperature coefficient of the LiTaO₃ substrate is negative, the frequency temperature coefficient of the SiO₂ layer has a positive value. Accordingly, a surface acoustic wave device whose total frequency temperature coefficient is approximately zero is provided, to thereby produce good frequency temperature characteristics.

Further, since the Euler angle of the LiTaO₃ substrate is within any one of the ranges provided in Table 1 mentioned above, the thicknesses of Al and SiO₂ layer of the IDT electrode are within the specific ranges provided in the ranges of the Euler angle indicated in Table 1, resonance characteristics and filter characteristics are further improved.

In particular, when the Euler angle of the LiTaO₃ substrate is within the ranges provided in Table 2, and when the Al thickness of the IDT electrode and the thickness of the SiO₂ layer are within the specific ranges corresponding to respective ranges of the Euler angle as provided in Table 2, the resonance characteristics and the filter characteristics are further improved.

Since, in the second preferred embodiment, a plurality of grooves are provided in the upper surface of the LiTaO₃ substrate, and the IDT electrode is filled in the grooves, the upper surface of the SiO₂ layer is flattened. Therefore, degradation of the insertion loss does not occur.

In addition, as is clear from the below-described example, since the electrode is defined by Al filled in the grooves, the reflection coefficient of the IDT electrode has a sufficient magnitude. Furthermore, since the Euler angle of the LiTaO₃ substrate is within any one of the ranges provided in Table 3, and the Al thickness of the IDT electrode and the thickness of the SiO₂ layer are within the specific ranges provided in Table 3, the resonance characteristics and the filter characteristics are further improved. In particular, when the Euler angles are within any one of the ranges provided in Table 4, and thicknesses of Al and SiO₂ layer are within the specific ranges provided in Table 4, the resonance characteristics and the filter characteristics are further improved.

Moreover, in the first preferred, when the Euler angle of the LiTaO₃ substrate is not only within any one of the ranges provided in Table 1, but also satisfies any one of the ranges of the Euler angle provided in Table 3, the resonance characteristics and the filter characteristics are further improved.

More preferably, when the Euler angle of the LiTaO₃ substrate satisfies not only any one of the ranges of the Euler angle provided in Table 1, but also any one of the ranges of the Euler angle provided in Table 4, the resonance characteristics and the filter characteristics are further improved.

Moreover, in the first preferred embodiment, when the range of the Euler angle satisfies any one of the ranges of the Euler angle provided in Table 2, and further satisfies any one of the ranges of the Euler angle provided in Table 3, the resonance characteristics and the filter characteristics are further improved. In particular, when the range of the Euler angle satisfies any one of the ranges of the Euler angle provided in Table 2 and any one of those provided in Table 4, the resonance characteristics and the filter characteristics are further improved.

When the IDT electrode, in addition to the electrode layer made of Al, has a close contact layer made of a metal or an alloy having a density greater than that of Al, the bonding strength between the IDT electrode and a LiTaO₃ substrate or a LiNbO₃ substrate is improved, and the electric power resistance to stress migration is also improved. Accordingly, the electric power resistance of a surface acoustic wave device is improved.

In addition, as the metal having a density greater than that of Al; Ti, Cu, W, Cr, Ni, etc. are included, and as the alloy having a density greater than that of Al, an alloy of Al and a metal having a density greater than that of Al, such as AlCu, an alloy of Al and an alloy such as NiCr, including primarily of a plurality of metals having a density greater than that of Al, are included.

In particular, since the Euler angle of the LiTaO₃ substrate is within any one of the ranges provided in Table 1, the substrate not only has good temperature characteristics, but also has a small attenuation constant α of about 0.05 (dB/λ) or less. Accordingly, good resonance characteristics or the filter characteristics are also obtained. More preferably, when the Euler angle is within any one of the ranges in Table 2, the attenuation constant α is about 0.025 (dB/λ) or less.

Moreover, when the above-mentioned LiTaO₃ substrate is a LiTaO₃ substrate whose Euler angle is within any one of the ranges provided in Table 3, the attenuation constant α is about 0.05 (dB/λ) or less, and more preferably, when the Euler angle is within any one of the ranges provided in Table 4, the attenuation constant α is about 0.025 (dB/λ) or less. Accordingly, since not only good temperature characteristics and a sufficient reflection coefficient are obtained, but also the attenuation constant is sufficiently small, better resonance characteristics or filter characteristics are obtained.

Moreover, when the thickness of Al or aluminum alloy defining the IDT electrode has a thickness corresponding to the Euler angle provided in Tables 1 to 4 mentioned above, resonance characteristics or filter characteristics having greatly improved temperature characteristics are obtained.

In a surface acoustic wave device according to a third preferred embodiment, a LiNbO₃ substrate is provided, and a plurality of grooves are provided in the upper surface of the LiNbO₃ substrate. An IDT electrode is defined by Al filled in the grooves. Moreover, a SiO₂ layer is arranged so as to cover the LiNbO₃ substrate and the IDT electrode, and so that the upper surface thereof is flattened. Consequently, degradation of the insertion loss does not occur.

In addition, since the electrode is made by filling Al, the reflection coefficient of the IDT electrode has a sufficient magnitude. Therefore, improved resonance characteristics or filter characteristics are obtained.

Moreover, while the frequency temperature coefficient of the LiNbO₃ substrate is a negative value, the frequency temperature coefficient of the SiO₂ layer is a positive value. Accordingly, a surface acoustic wave device with good frequency temperature characteristics is provided.

Furthermore, since the Euler angle of the LiNbO₃ substrate is within any one of the ranges provided in Table 5 mentioned-above, the resonance characteristics and the filter characteristics are improved further.

In particular, when the Euler angle of the LiNbO₃ substrate is within the range provided in Table 5 and in Table 6, the thicknesses of Al of the IDT electrode and the SiO₂ layer are within the specific ranges corresponding to the ranges of the Euler angle, the resonance characteristics and the filter characteristics are further improved.

Moreover, in the third preferred embodiment, when the normalized film thickness of the IDT electrode is within the range of about 0.06 to about 0.12, the frequency temperature characteristics are further improved.

In the third preferred embodiment, when the normalized film thickness of the SiO₂ layer is within the range of about 0.25 to about 0.3, similarly, the frequency temperature characteristics are further improved.

In preferred embodiments of the present invention, when the upper surface of the electrode is flush with the upper surface of the piezoelectric substrate, even if the surface of an insulator layer is made using a conventional film forming method, the insulator layer is flattened. In addition, the upper surface of the electrode is not necessarily made to be flush with the upper surface of the piezoelectric substrate. Instead, the upper surface of the electrode may protrude slightly upward from the upper surface of the piezoelectric substrate, or may be slightly recessed a little below the upper surface of the piezoelectric substrate.

In preferred embodiments of the present invention, when the internal angles of the grooves are within the range of about 45° to about 90°, and more preferably, about 50° to about 80°, since the change of the electromechanical coupling coefficient due to the fluctuations of the internal angles of the grooves is small, the fluctuations of the characteristics of a surface acoustic wave device is reduced. In other words, even if the internal angles of the grooves slightly fluctuate during manufacturing, a surface acoustic wave device with stable characteristics is provided.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Hereinafter, the present invention will be described with reference to specific preferred embodiments and experimental examples, and with reference to drawings.

Now, with reference to FIGS. 1A to 1F and 2, the manufacturing method of a surface acoustic wave device according to a preferred embodiment of the present invention will be described.

Figure 1:
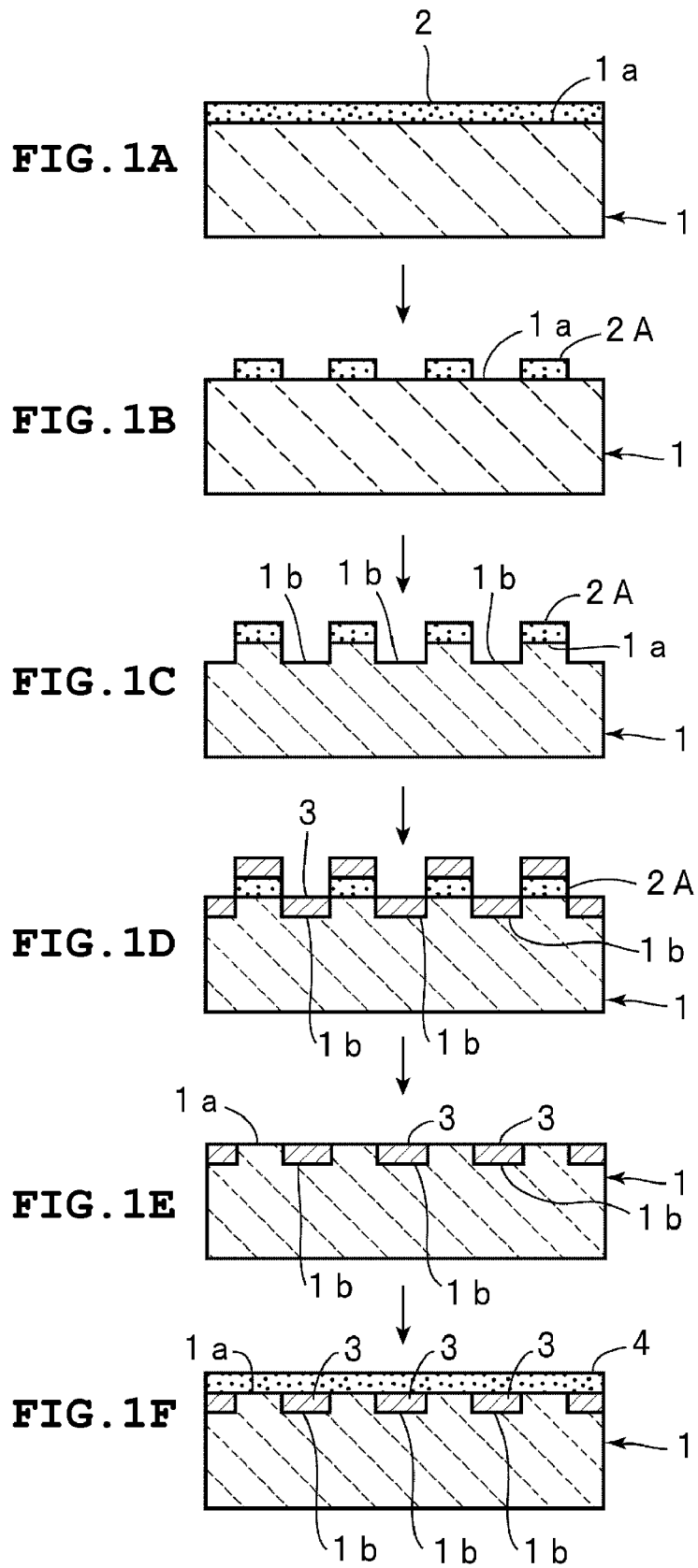
FIGS. 1A to 1F are front cross-sectional views explaining a manufacturing method of a surface acoustic wave device according to a first preferred of the present invention.

As shown in FIGS. 1A and 1B, first, a LiTaO$_3$ substrate is prepared.

More specifically, in the present preferred embodiment, a LiTaO$_3$ substrate of 36° rotation and Y-plate X-propagation, whose Euler angle is (0°, 126°, 0°), is preferably used as a LiTaO$_3$ substrate 1. However, as described below, the Euler angle can be varied. In addition, there are the following relationships: $\theta$ of the Euler angle ($\phi$, $\theta$, $\psi$)=rotational cut angle+ 90°, and ($\phi$, $\theta$, $\psi$)=(60°+$\phi$, −$\theta$, $\psi$)=(60°−$\phi$, −$\theta$, 180° −$\psi$)=($\phi$, 180°+$\theta$, 180°−$\psi$)=($\phi$, $\theta$, 180°+$\psi$).

Next, a photoresist layer 2 is formed on the entire upper surface 1a of the LiTaO$_3$ substrate 1. As the photoresist layer 2, a suitable photoresist material which can withstand reactive ion etching (RIE) to be performed at a later stage is preferably used. In the example, posi-resist: product number AZ-1500, made by Clariant Japan K. K. was preferably used. Moreover, in this example the thickness of the above photoresist layer was about 2 μm.

Next, by exposing and cleaning the photoresist layer, as shown in FIG. 1B, the photoresist layer 2 was patterned, and a photoresist pattern 2A was formed. In the photoresist pattern 2A, in the portion in which an IDT electrode is to be formed at a later stage, the photoresist layer was removed.

Subsequently, reactive ion etching was performed, and as shown in FIG. 1C, a plurality of grooves 1b were formed in the upper surface 1a of the LiTaO$_3$ substrate 1 with a desired depth. The desired depth is the same as the film thickness of the IDT electrode to be formed at a later stage. However, the etching depth may be slightly greater or less than the film thickness of the IDT electrode.

Next, an Al film was formed by evaporation or sputtering. As a result, as shown in FIG. 1D, an Al film, that is an electrode film 3, was filled in the grooves 1b. In addition, the Al film was also formed on the upper surface of the remaining photoresist pattern 2A.

The LiTaO$_3$ substrate was then immersed in a releasing solution such as acetone, and the photoresist pattern 2A and the Al film on the photoresist pattern 2A were removed. In this manner, as shown in FIG. 1E, since the electrode film 3 was filled in the grooves 1b, the LiTaO$_3$ substrate 1 having a substantially flat upper surface was obtained.

As shown in FIG. 1F, the SiO$_2$ film 4 was formed on the upper surface of the LiTaO$_3$ substrate 1. The surface of the SiO$_2$ film was flattened. This is because, since the upper surfaces 1a of the LiTaO$_3$ substrate 1 is substantially flush with the electrode film 3 and substantially flattened, when a SiO$_2$ film is formed by an existing film forming method, the surface of the SiO$_2$ film is flattened.

In addition, the film forming method of the SiO$_2$ film is not particularly limited, and appropriate methods such as screen printing, evaporation, or sputtering may be used.

In FIGS. 1A to 1F, by describing only the electrode portion, representatively, the manufacturing method of a surface acoustic wave device of this preferred embodiment was described. In this manner, a 1-port-type surface acoustic wave resonator 11 whose plan view is shown in FIG. 2 was obtained.

In addition, the 1-port-type surface acoustic wave resonator 11 includes reflectors 12 and 13 which are disposed along the surface acoustic wave propagation direction at both sides of the electrode film 3 defining the IDT electrode. The reflectors 12 and 13 are also formed by the same process as that used to form the electrode film 3 defining the IDT electrode.

Figure 2:
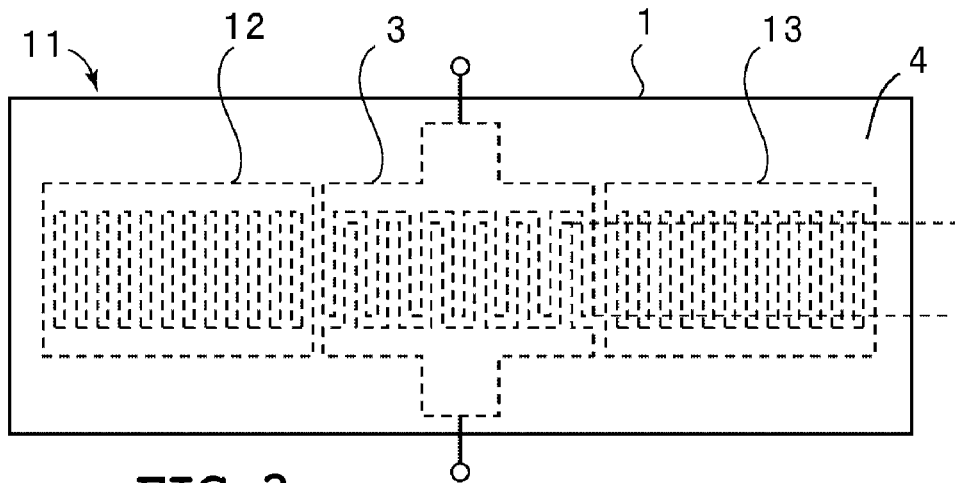
FIG. 2 is a schematic plan view showing the electrode structure of a surface acoustic wave resonator as an example of the surface acoustic wave device obtained in example shown in FIGS. 1A to 1F.

Although, in the manufacturing method of the surface acoustic wave device of this preferred embodiment described with reference to FIGS. 1A to 1F, and the 1-port-type surface acoustic wave resonator 11 whose plan view is shown in FIG. 2, the LiTaO$_3$ substrate was used, when a LiNbO$_3$ substrate is used, a similar configuration is obtained.

EXPERIMENTAL EXAMPLE 1

For comparison, a plurality of types of surface acoustic wave resonators formed in a manner similar to the above-described preferred embodiment, except for being obtained according to the manufacturing method described in Patent Document 1 were manufactured in the following manner. In the experimental example 1, a LiTaO$_3$ substrate was used.

In other words, as a surface acoustic wave resonator of the above experimental example and a comparative example, a plurality of types of surface acoustic wave resonators were obtained by varying the film thickness of the electrode. In addition, the normalized film thickness H/λ of the SiO$_2$ film was set to about 0.25. Herein, the normalized film thickness of the electrode or the SiO$_2$ film is a value expressed by H/λ, where the film thickness is denoted by H and the wavelength of the IDT is denoted by λ. The electromechanical coupling constants of the surface acoustic wave resonators produced in the same manner as above were measured. The results are shown in FIG. 3.

Figure 3:
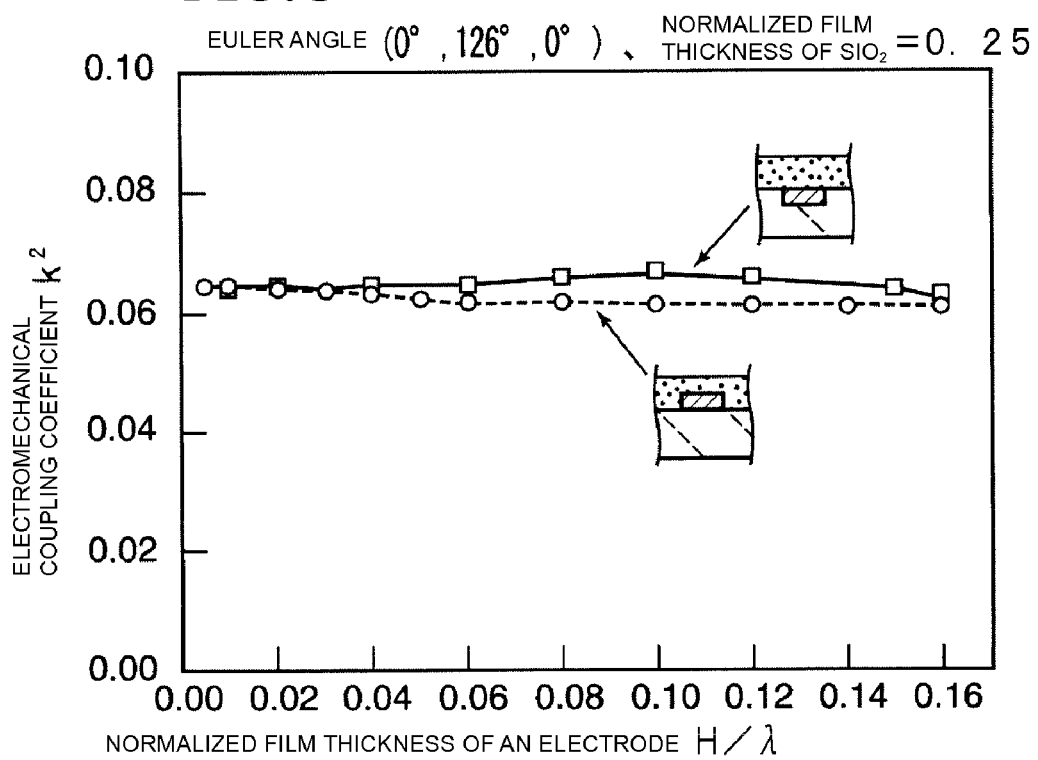
FIG. 3 is a view showing the changes of the electromechanical coupling coefficient in surface acoustic wave resonators of the first preferred embodiment and a comparative example 1 when the film thickness of the electrode is changed.

In FIG. 3, a solid line shows the results of the example, a dotted line shows the results of the comparative example. As shown in FIG. 3, according to the above preferred embodiment, the electromechanical coupling constant of the surface acoustic wave resonator is the same as or greater than that of the surface acoustic wave resonator in the comparative example. In particular, when the normalized film thickness H/λ of the electrode is within the range of about 0.06 to about 0.12, the electromechanical coupling constant of the surface acoustic wave resonator is improved by an order of about 0.03 as compared to that of the surface acoustic wave resonator in the comparative example.

EXPERIMENTAL EXAMPLE 2

Next, in addition to the surface acoustic wave resonators of the above preferred embodiment and the comparative example 1, a known surface acoustic wave resonator whose $SiO_2$ film has a non-flat surface is produced as a surface acoustic wave resonator of a comparative example 2. In the surface acoustic wave resonators, the Euler angle of the $LiTaO_3$ substrate and the normalized film thickness of the $SiO_2$ film were set to values similar to those when the results shown in FIG. 3 were obtained.

In the experimental example 2, a plurality of types of surface acoustic wave resonators were also produced by varying the normalized film thickness H/λ of the electrode, and the reflection coefficients thereof were obtained. The results are shown in FIG. 4.

Figure 4:
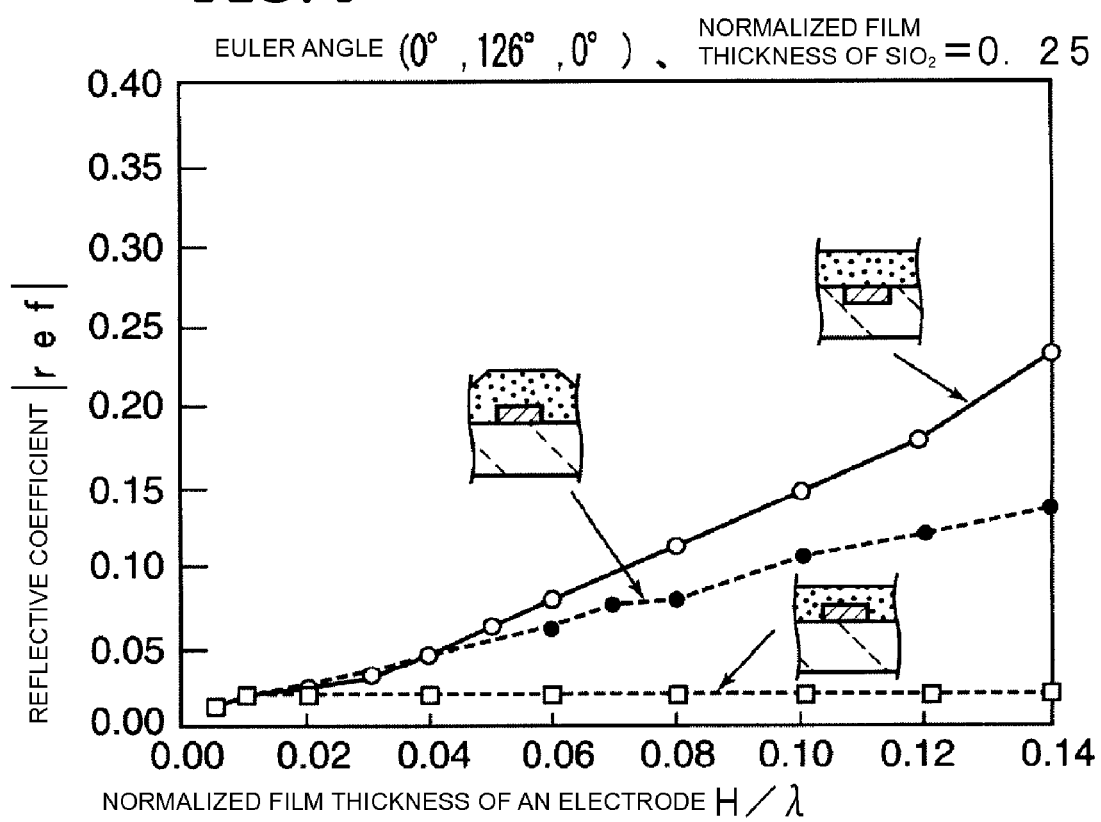
FIG. 4 is a view showing the changes of the reflection coefficients in surface acoustic wave resonators of the first preferred embodiment and comparative examples 1 and 2 when the film thickness of the electrode is changed.

As shown in FIG. 4, in the surface acoustic wave resonator of the comparative example 1, it is known that even when the normalized film thickness of the electrode is increased, the reflection coefficient does not substantially increase. To the contrary, in the surface acoustic wave resonator of the preferred embodiment, as the normalized film thickness of the electrode is increased, the reflection coefficient becomes sufficiently high. In particular, as compared to the surface acoustic wave resonator of the comparative example 2 which has problems due to the surface of the $SiO_2$ film being uneven, and the insertion loss being large, the effect of increase of the reflection coefficient due to the increase of the film thickness of the electrode is known.

Accordingly, from the results of FIGS. 3 and 4, according to the above preferred embodiment, since the electromechanical coupling constant is sufficiently large, and the film thickness of the electrode is increased, a sufficient magnitude of reflection coefficient is obtained.

Another Preferred Embodiment of a Manufacturing Method

Although in the above examples, the surface acoustic wave resonator 11 was produced in accordance with the production method shown in FIGS. 1A to 1F, the production method for obtaining a surface acoustic wave device of the present invention is not limited to the manufacturing method shown in FIGS. 1A to 1F.

FIGS. 5A to 5D are schematic front cross-sectional views for explaining the second preferred embodiment for manufacturing a surface acoustic wave device of the present invention.

Figure 5:
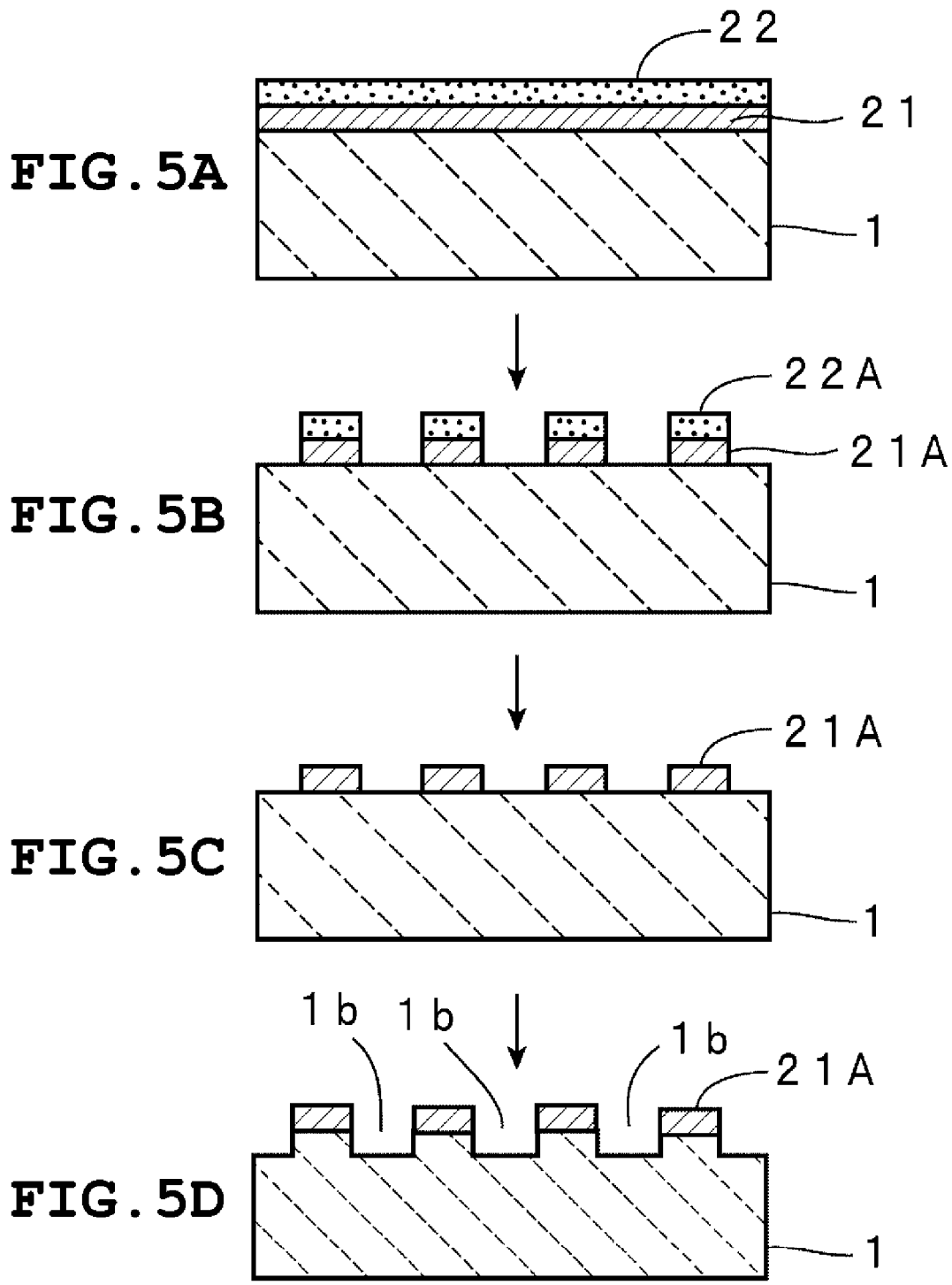
FIGS. 5A to 5D are schematic front cross-sectional views explaining a second preferred embodiment of the manufacturing method of a surface acoustic wave device of the present invention.

In the manufacturing method, as shown in FIG. 5A, first, an inorganic thin-film 21 composed of inorganic materials, such as SiN and ZnO, is formed on the $LiTaO_3$ substrate 1. Next, a photoresist layer 22 is formed on the entire surface of the inorganic thin-film 21.

By subjecting the photoresist layer 22 to exposure/developing treatment, the photoresist layer 22 and the inorganic thin-film 21 under the photoresist layer 22 are patterned. In this manner, as shown in FIG. 5B, an inorganic material thin-film pattern 21A and a photoresist pattern 22A are obtained.

Using a solvent, the photoresist pattern 22A is removed. In this manner, as shown in FIG. 5C, a structure in which the inorganic material thin-film pattern 21A is formed on the upper surface of the $LiTaO_3$ substrate 1 as a piezoelectric substrate is obtained.

By reactive ion etching, as shown in FIG. 5D, a region in which the thin-film pattern 21A of an inorganic material is not formed is etched. In this manner, a plurality of the grooves 1b are formed.

Subsequently, an Al film is formed by evaporation or sputtering. In a manner similar to the structure shown in FIG. 1D, an electrode film is formed by filling Al into the plurality of the grooves, and the electrode film adheres to the inorganic material thin-film pattern 22A. After that, by immersing the $LiTaO_3$ substrate in a releasing solution, the above inorganic material thin-film pattern 21A and the electrode film remaining thereon are released. In this manner, a structure similar to that shown in FIG. 1E is obtained. Accordingly, if the $SiO_2$ film is formed next, in a manner similar to the structure shown in FIG. 1F, a $SiO_2$ film having a substantially flat surface is produced.

EXPERIMENTAL EXAMPLE 3

Next, in a surface acoustic wave resonator shown in FIG. 2, a plurality of types of surface acoustic wave resonator of the examples were produced, by setting the Euler angle of the $LiTaO_3$ substrate to (0°, 126°, 0°), varying the normalized film thickness H/λ of the electrode formed of Al, and further varying the normalized film thickness H/λ of the $SiO_2$ film. Moreover, for comparison, in the surface acoustic wave resonator of the comparative example 1 mentioned above, a plurality of types of surface acoustic wave resonator were also produced by changing the normalized film thicknesses of the electrode and the $SiO_2$ film. The reflection coefficients and electromechanical coupling constants of these surface acoustic wave resonators were obtained. The results are shown in FIGS. 6 and 7, respectively.

Figure 6:
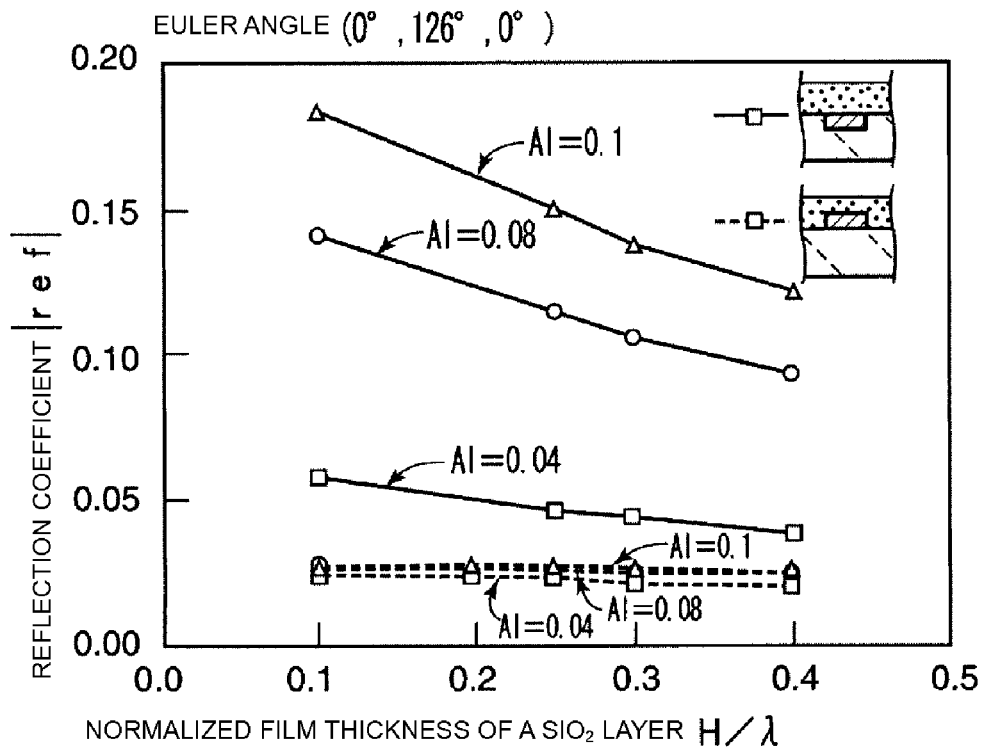
FIG. 6 is a view showing the change of the reflection coefficient when the normalized thicknesses of the electrode of Al and the SiO₂ layer using a LiTaO₃ substrate of (0°, 126°, 0°) in surface acoustic wave resonators in the second preferred embodiment and the comparative example 1.
Figure 7:
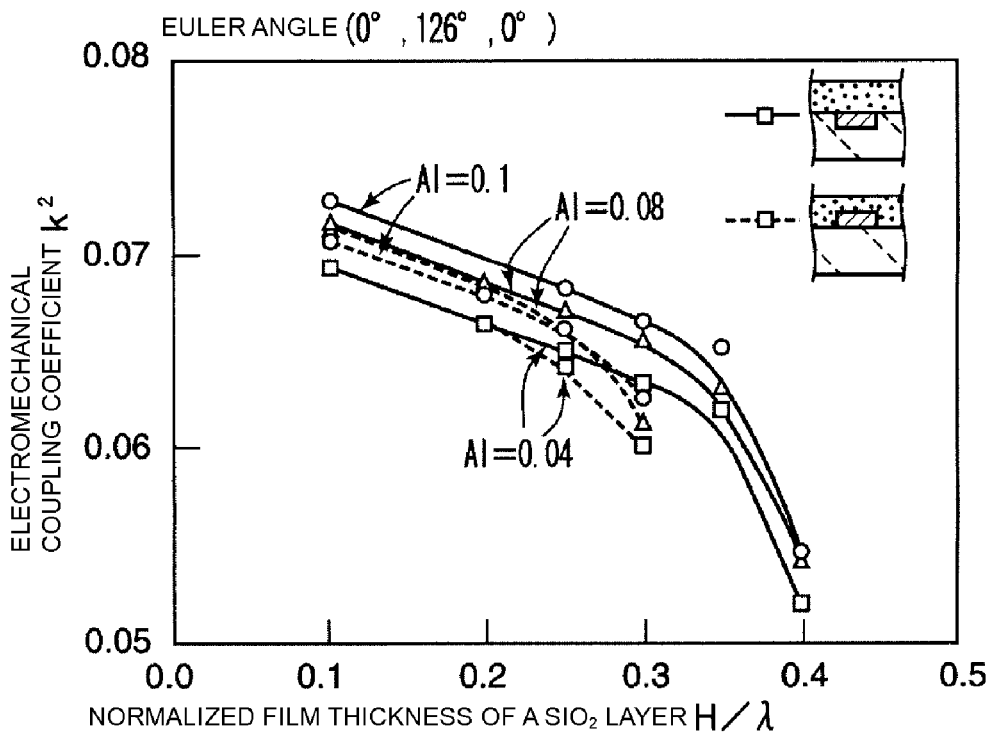
FIG. 7 is a view showing the change of the electromechanical coupling coefficient when the normalized thicknesses of the electrode of Al and the SiO₂ layer using the LiTaO₃ substrate of (0°, 126°, 0°) in surface acoustic wave resonators of the second preferred embodiment and the comparative example 1.

In FIGS. 6 and 7, solid lines show the results of the surface acoustic wave resonators of the present preferred embodiment, and dotted lines show the results of the surface acoustic wave resonators of the comparative example 1.

As shown in FIG. 6, in the surface acoustic wave resonators of the present preferred embodiment, it is known that even when the normalized film thickness of the electrode is increased, the reflection coefficient does not become high.

Moreover, as shown in FIG. 7, in the surface acoustic wave resonator of the present preferred embodiment, an electromechanical coupling coefficient that is equal to or greater than that of the surface acoustic wave resonator of the comparative example 1 is obtained, regardless of the film thicknesses of the $SiO_2$ film and the thickness of the electrode made of Al. In particular, in the range in which the normalized film thickness H/λ of the $SiO_2$ film is equal to or greater than about 0.3, according to the present preferred embodiment, a sufficiently high electromechanical coupling coefficient is also obtained.

Next, using $LiTaO_3$ substrates with various Euler angles, by changing the normalized film thickness H/λ of the electrode formed of Al to approximately 0.06, 0.08, or 0.1, $SiO_2$ films with various normalized film thicknesses were produced, a plurality of types of surface acoustic wave resonator of the present preferred embodiment were produced, and then the frequency temperature coefficient TCF was measured. The results are shown in FIGS. 8 to 10.

In addition, TCF is defined by the following formula.

TCF=((frequency at 80° C.)−(frequency at −20° C.))/ (100×(frequency at about 25° C.))

Figure 8:
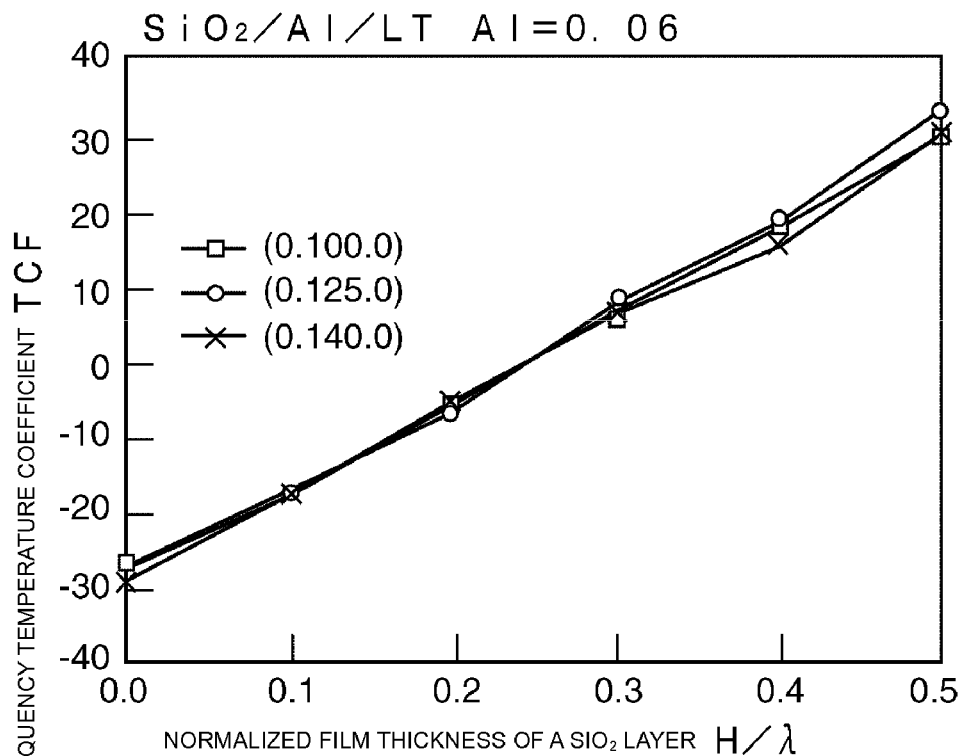
FIG. 8 is a view showing the change of the frequency-temperature coefficient TCF when the Euler angle of the LiTaO₃ substrate is changed, the normalized film thickness of the electrode made of Al is about 0.06, and the normalized film thickness of the SiO₂ layer is changed, in surface acoustic wave devices of the second preferred embodiment.
Figure 9:
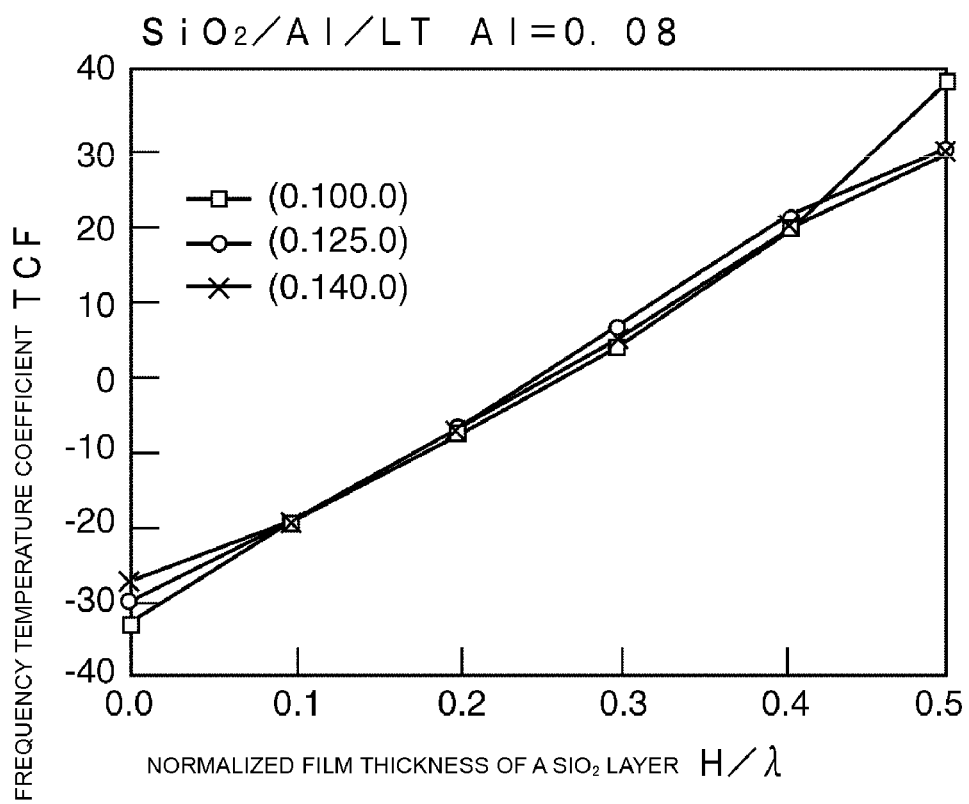
FIG. 9 is a view showing the change of the frequency-temperature coefficient TCF when the Euler angle of the LiTaO₃ substrate is varied, the normalized film thickness of the electrode made of Al is about 0.08, and the normalized film thickness of the SiO₂ layer is changed, in surface acoustic wave devices of the second preferred embodiment.
Figure 10:
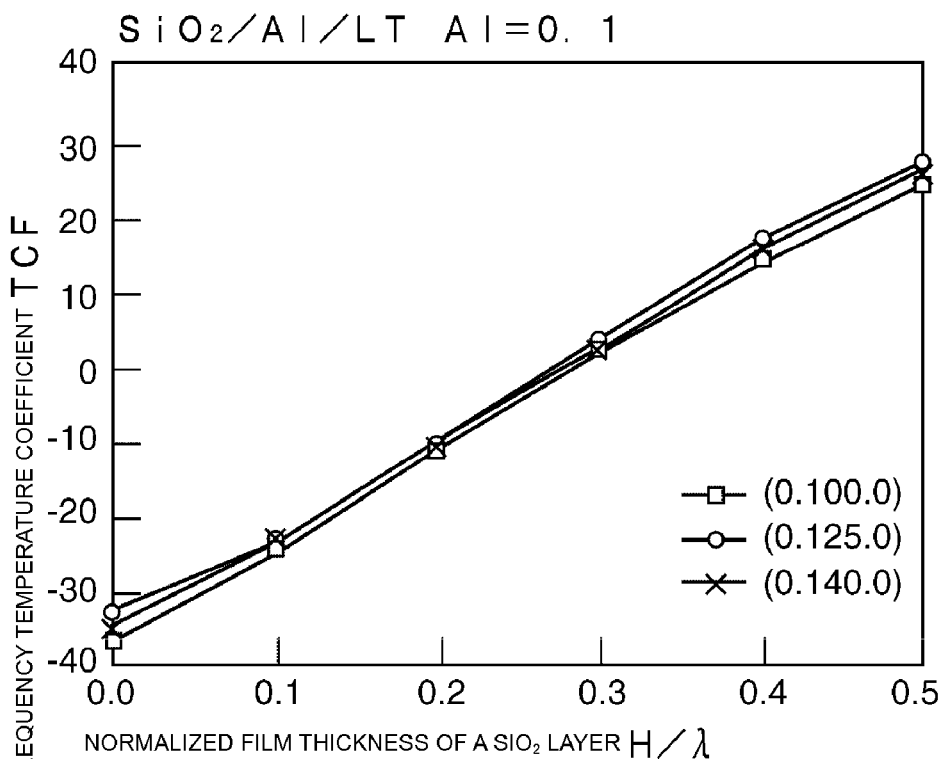
FIG. 10 is a view showing the change of the frequency-temperature coefficient TCF when the Euler angle of the LiTaO₃ substrate is changed, the normalized film thickness of the electrode made of Al is about 0.1, and the normalized film thickness of the SiO₂ layer is changed, in surface acoustic wave devices of the second preferred embodiment.

As shown in FIGS. 8 to 10, regardless of the normalized film thickness of the electrode made of Al, by increasing the thickness of the $SiO_2$ film, the frequency temperature coefficient TCF is shifted from a negative value to a positive value, and further enlarged in the positive region. This is because the SiO$_2$ film has a positive frequency temperature coefficient.

As shown in FIGS. 8 to 10, when LiTaO$_3$ substrates with various Euler angles are used, since, by increasing the thickness of the SiO$_2$ film, the frequency temperature coefficient is enlarged, and a difference in the frequency temperature coefficient due to the difference between the Euler angles is relatively small. In addition, the film thickness H/λ of the SiO$_2$ film is preferably within the range of about 0.15 to about 0.4, and more preferably, about 0.2 to about 0.35, the absolute value of the frequency temperature coefficient TCF is equal to or less than about 15 ppm/° C., or about 10 ppm/° C., respectively, thereby, outstanding frequency temperature characteristics are obtained.

Next, in the surface acoustic wave resonator of the present preferred embodiment, a plurality of surface acoustic wave resonators are produced by varying the Euler angle of the LiTaO$_3$ substrate to be used, and further by varying the normalized film thicknesses of the electrode and the SiO$_2$ film. The attenuation constants α of the obtained surface acoustic wave resonators were measured. The results are shown in FIGS. 11 to 16.

Figure 11:
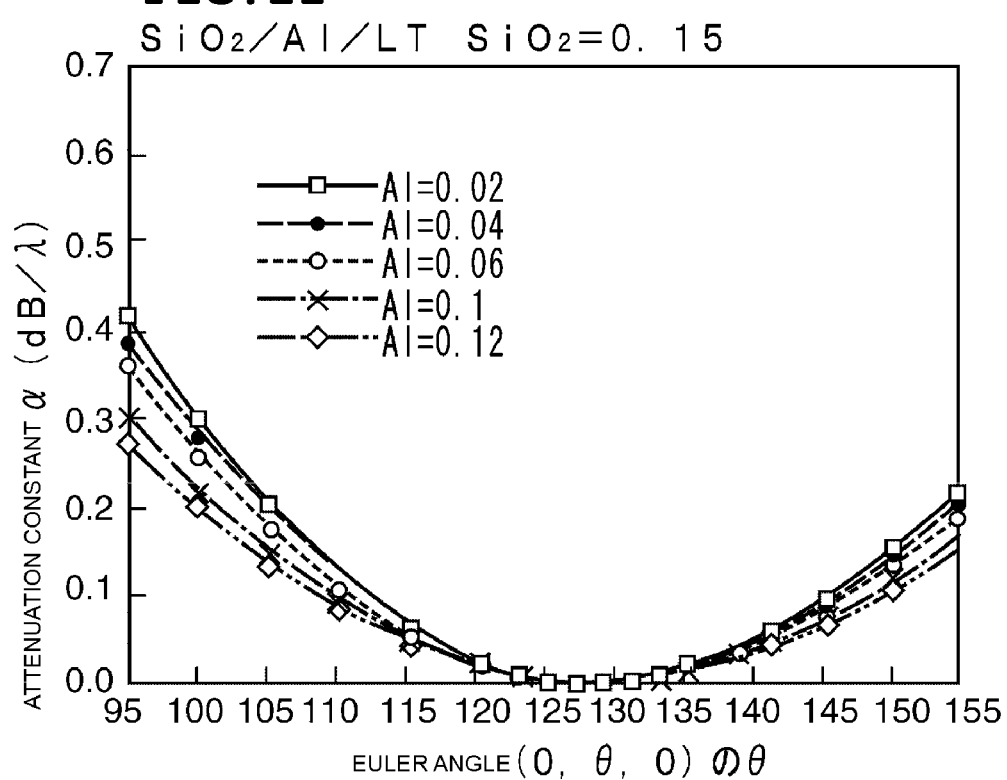
FIG. 11 is a view showing the change of the attenuation constant at the resonance frequency side when the normalized film thickness of the SiO₂ layer is about 0.15, and the Euler angle θ of the LiTaO₃ substrate and the normalized film thickness of the electrode made of Al are changed, in surface acoustic wave devices of the second preferred embodiment.
Figure 12:
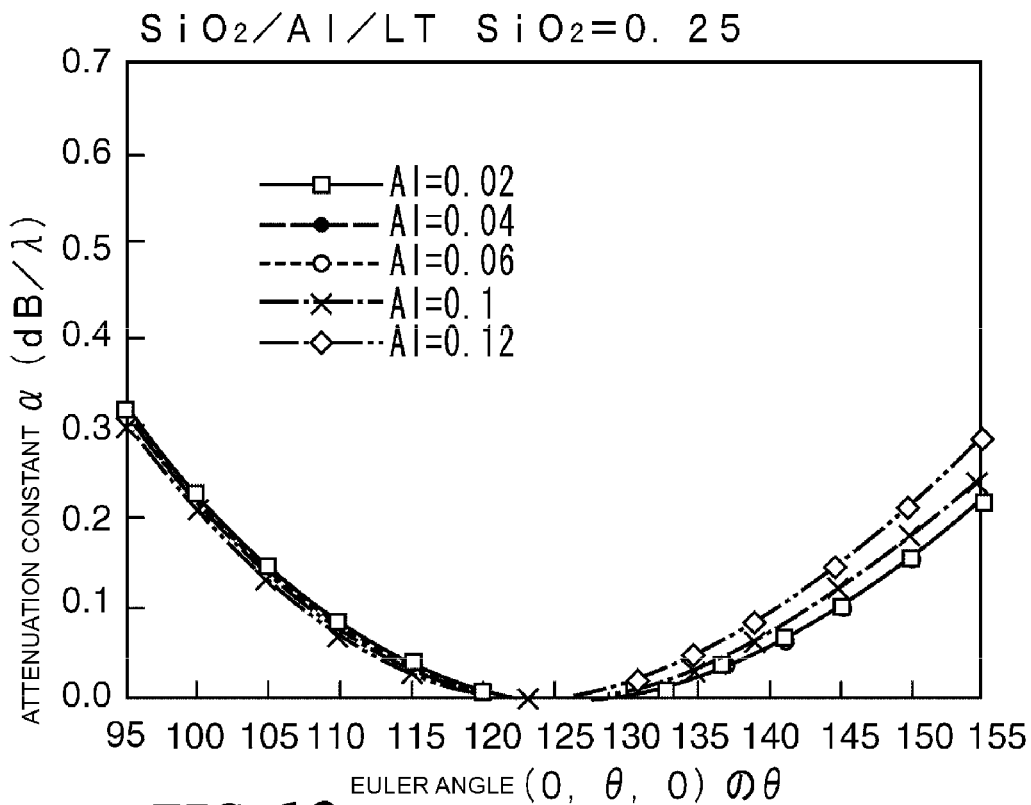
FIG. 12 is a view showing the change of the attenuation constant at the resonance frequency side when the normalized film thickness of the SiO₂ layer is about 0.25, and the Euler angle θ of the LiTaO₃ substrate and the normalized film thickness of the electrode made of Al are changed, in surface acoustic wave devices of the second preferred embodiment.
Figure 13:
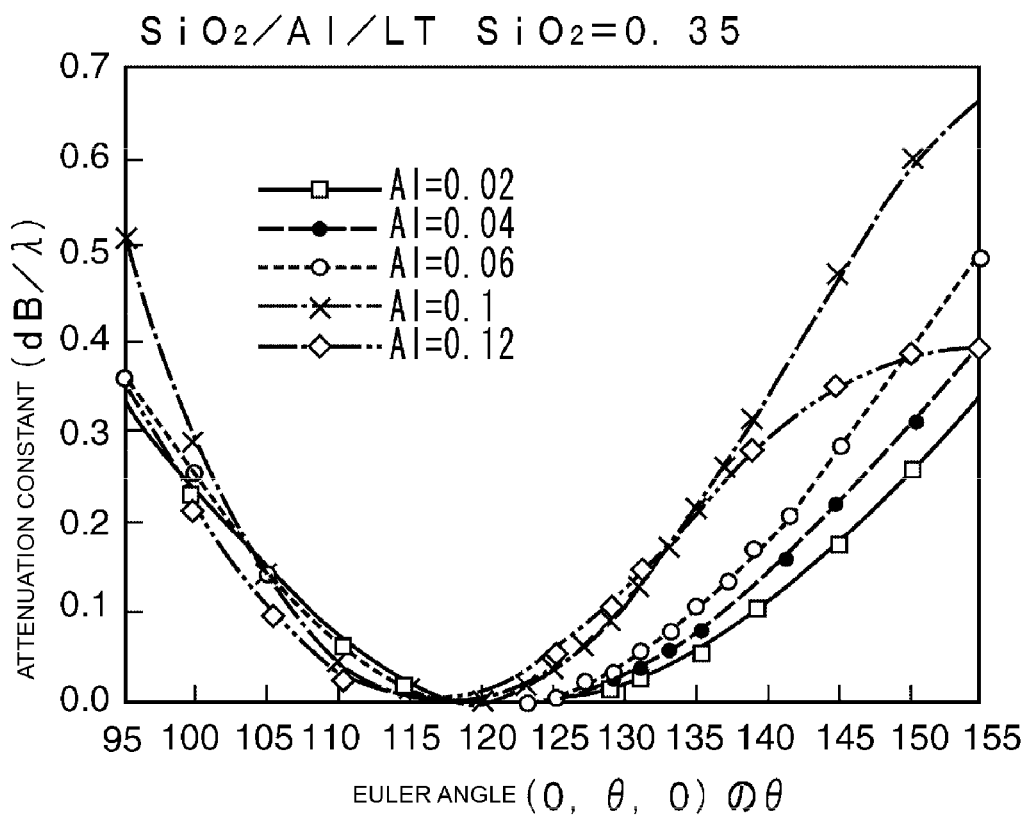
FIG. 13 is a view showing the change of the attenuation constant at the resonance frequency side when the normalized film thickness of the SiO₂ layer is about 0.35, and the Euler angle θ of the LiTaO₃ substrate and the normalized film thickness of the electrode made of Al are changed, in surface acoustic wave devices of the second preferred embodiment.
Figure 14:
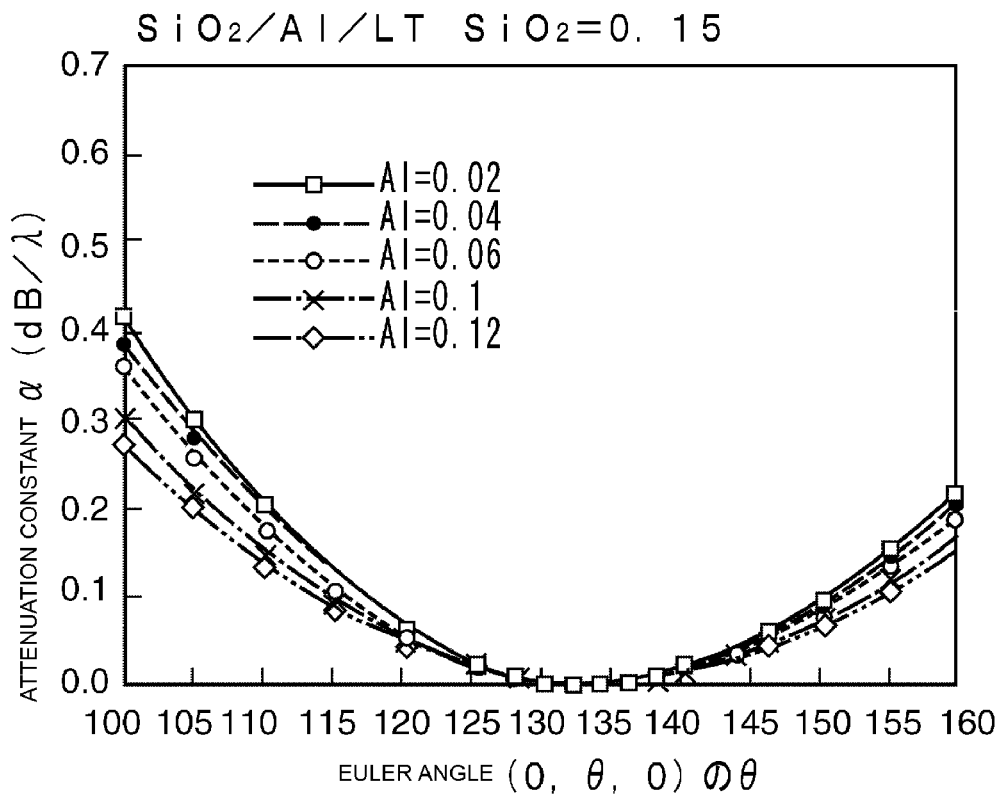
FIG. 14 is a view showing the change of the attenuation constant at the anti-resonance frequency side when the normalized film thickness of the SiO$_2$ layer is about 0.15, and the Euler angle θ of the LiTaO$_3$ substrate and the normalized film thickness of the electrode made of Al are changed, in surface acoustic wave devices of the second preferred embodiment.
Figure 15:
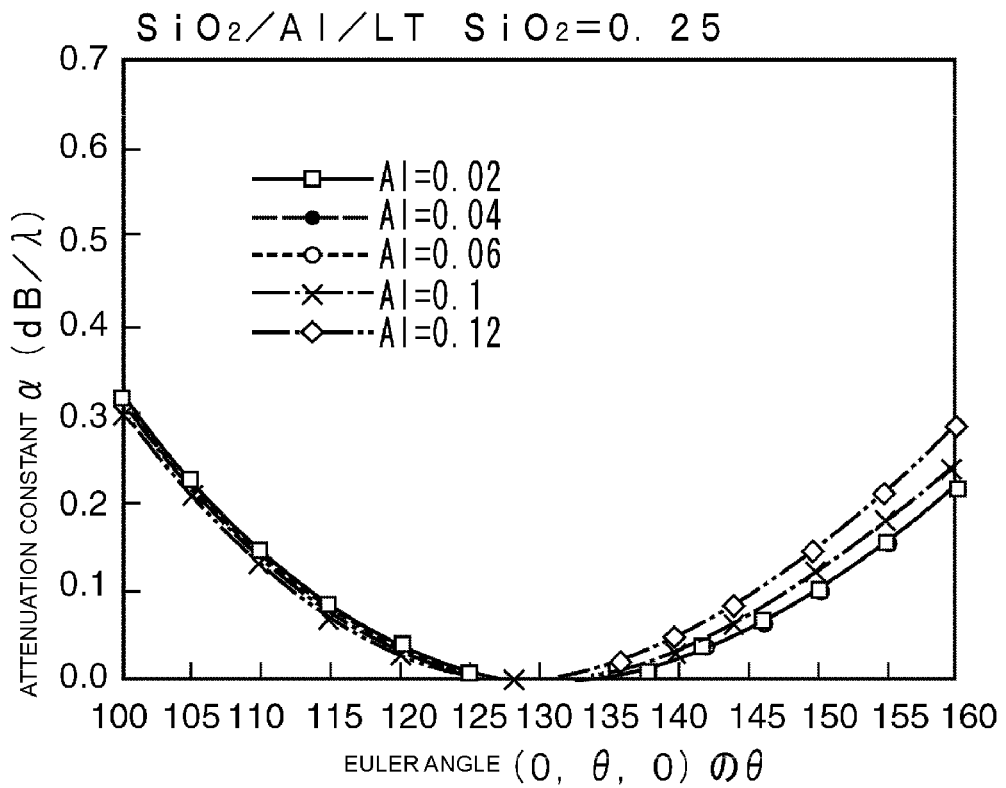
FIG. 15 is a view showing the change of the attenuation constant at the anti-resonance frequency side when the normalized film thickness of the SiO$_2$ layer is about 0.25, and the Euler angle θ of the LiTaO$_3$ substrate and the normalized film thickness of the electrode made of Al are changed, in surface acoustic wave devices of the second preferred embodiment.
Figure 16:
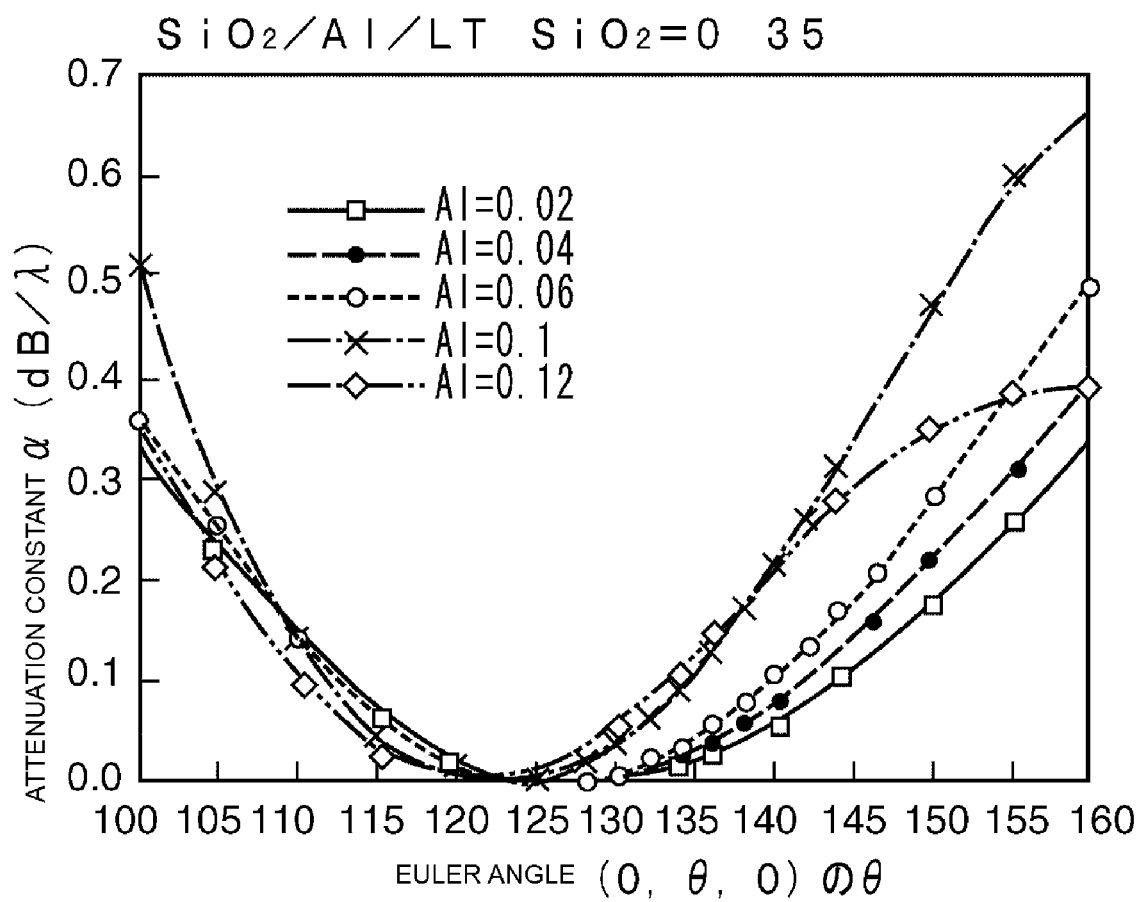
FIG. 16 is a view showing the change of the attenuation constant at the anti-resonance frequency side when the normalized film thickness of the SiO$_2$ layer is about 0.35, and the Euler angle θ of the LiTaO$_3$ substrate and the normalized film thickness of the electrode made of Al are changed, in surface acoustic wave devices of the second preferred embodiment.

In addition, in FIGS. 11 to 13, the changes in the attenuation constants α at a resonance frequency of the surface acoustic wave resonators are shown, and in FIGS. 14 to 16, the changes in the attenuation constants α at an anti-resonance frequency of the surface acoustic wave resonators are shown. Accordingly, in a filter, if the attenuation constants α shown in FIGS. 11 to 13 are decreased, the steepness of the filter characteristics at the lower side of the pass band is increased. Moreover, if the attenuation constants α shown in FIGS. 14 to 16 are decreased, the steepness of the filter characteristics at the higher side of the passing band is increased.

As shown in FIGS. 11 to 13, regardless of the film thicknesses of the electrode made of Al and the SiO$_2$ film, by setting θ of the Euler angle of the LiTaO$_3$ substrate to be within a suitable range, the attenuation constants α are significantly reduced. In other words, from FIGS. 11 to 13, it can be seen that, when it is necessary for the steepness of the filter characteristics at the lower side of the pass band to be increased, the Euler angle should be within any one of the ranges provided in Table 7 described below, and more preferably, any one of the ranges provided in Table 8.

TABLE 7

| | α = 0.05 or less<br>θ of Euler angle (0, θ, 0) |
|---|---|
| 0.125 <= SiO$_2$ layer thickness <= 0.20 | |
| 0.02 <= Al thickness < 0.04 | (0, 114° to 142°, 0) |
| 0.04 <= Al thickness < 0.06 | (0, 115° to 143°, 0) |
| 0.06 <= Al thickness < 0.1 | (0, 113° to 145°, 0) |
| 0.1 <= Al thickness < 0.14 | (0, 112° to 146°, 0) |
| 0.20 <= SiO$_2$ layer thickness <= 0.275 | |
| 0.02 <= Al thickness < 0.04 | (0, 113° to 140°, 0) |
| 0.04 <= Al thickness < 0.06 | (0, 113° to 140°, 0) |
| 0.06 <= Al thickness < 0.1 | (0, 111° to 140°, 0) |
| 0.1 <= Al thickness < 0.14 | (0, 111° to 140°, 0) |
| 0.275 <= SiO$_2$ layer thickness <= 0.35 | |
| 0.02 <= Al thickness < 0.04 | (0, 111° to 137°, 0) |
| 0.04 <= Al thickness < 0.06 | (0, 111° to 137°, 0) |
| 0.06 <= Al thickness < 0.1 | (0, 109° to 136°, 0) |
| 0.1 <= Al thickness < 0.14 | (0, 107° to 136°, 0) |

Each of SiO$_2$ layer thickness and Al thickness is normalized film thickness H/λ.

TABLE 8

| | α = 0.025 or less<br>θ of Euler angle (0, θ, 0) |
|---|---|
| 0.125 <= SiO$_2$ layer thickness <= 0.20 | |
| 0.02 <= Al thickness < 0.04 | (0, 118° to 137°, 0) |
| 0.04 <= Al thickness < 0.06 | (0, 117° to 139°, 0) |
| 0.06 <= Al thickness < 0.1 | (0, 117° to 141°, 0) |
| 0.1 <= Al thickness < 0.14 | (0, 116° to 141°, 0) |
| 0.20 <= SiO$_2$ layer thickness <= 0.275 | |
| 0.02 <= Al thickness < 0.04 | (0, 115° to 137°, 0) |
| 0.04 <= Al thickness < 0.06 | (0, 115° to 138°, 0) |
| 0.06 <= Al thickness < 0.1 | (0, 115° to 138°, 0) |
| 0.1 <= Al thickness < 0.14 | (0, 114° to 136°, 0) |
| 0.275 <= SiO$_2$ layer thickness <= 0.35 | |
| 0.02 <= Al thickness < 0.04 | (0, 113° to 137°, 0) |
| 0.04 <= Al thickness < 0.06 | (0, 113° to 137°, 0) |
| 0.06 <= Al thickness < 0.1 | (0, 111° to 136°, 0) |
| 0.1 <= Al thickness < 0.14 | (0, 112° to 133°, 0) |

Each of SiO$_2$ layer thickness and Al thickness is normalized film thickness H/λ.

Moreover, as shown in FIGS. 14 to 16, when the steepness of the filter waveform at the higher side of the pass band must be increased, the Euler angle within any one of the ranges provided in Table 9 described below, and more preferably, any one of the ranges provided in Table 10 should be selected.

TABLE 9

| | α = 0.05 or less<br>θ of Euler angle (0, θ, 0) |
|---|---|
| 0.125 <= SiO$_2$ layer thickness <= 0.20 | |
| 0.02 <= Al thickness < 0.04 | (0, 119° to 152°, 0) |
| 0.04 <= Al thickness < 0.06 | (0, 120° to 153°, 0) |
| 0.06 <= Al thickness < 0.1 | (0, 124° to 158°, 0) |
| 0.1 <= Al thickness < 0.14 | (0, 128° to 155°, 0) |
| 0.20 <= SiO$_2$ layer thickness <= 0.275 | |
| 0.02 <= Al thickness < 0.04 | (0, 123° to 152°, 0) |
| 0.04 <= Al thickness < 0.06 | (0, 124.5° to 153°, 0) |
| 0.06 <= Al thickness < 0.1 | (0, 123.5° to 154°, 0) |
| 0.1 <= Al thickness < 0.14 | (0, 119° to 157°, 0) |
| 0.275 <= SiO$_2$ layer thickness <= 0.35 | |
| 0.02 <= Al thickness < 0.04 | (0, 124° to 150°, 0) |
| 0.04 <= Al thickness < 0.06 | (0, 124° to 146°, 0) |
| 0.06 <= Al thickness < 0.1 | (0, 114° to 149°, 0) |
| 0.1 <= Al thickness < 0.14 | (0, 103° to 148°, 0) |

Each of SiO$_2$ layer thickness and Al thickness is normalized film thickness H/λ.

TABLE 10

| | α = 0.25 or less<br>θ of Euler angle (0, θ, 0) |
|---|---|
| 0.125 <= SiO$_2$ layer thickness <= 0.20 | |
| 0.02 <= Al thickness < 0.04 | (0, 123° to 148°, 0) |
| 0.04 <= Al thickness < 0.06 | (0, 127° to 149°, 0) |
| 0.06 <= Al thickness < 0.1 | (0, 127.5° to 154°, 0) |
| 0.1 <= Al thickness < 0.14 | (0, 132° to 158°, 0) |
| 0.20 <= SiO$_2$ layer thickness <= 0.275 | |
| 0.02 <= Al thickness < 0.04 | (0, 127° to 148°, 0) |
| 0.04 <= Al thickness < 0.06 | (0, 128° to 149°, 0) |
| 0.06 <= Al thickness < 0.1 | (0, 128° to 149°, 0) |
| 0.1 <= Al thickness < 0.14 | (0, 124° to 155°, 0) |

TABLE 10-continued

|  | α = 0.25 or less<br>θ of Euler angle (0, θ, 0) |
|---|---|
| 0.275 <= SiO₂ layer thickness <= 0.35 | |
| 0.02 <= Al thickness < 0.04 | (0, 128° to 146°, 0) |
| 0.04 <= Al thickness < 0.06 | (0, 128° to 146°, 0) |
| 0.06 <= Al thickness < 0.1 | (0, 119° to 146°, 0) |
| 0.1 <= Al thickness < 0.14 | (0, 110° to 145°, 0) |

Each of SiO₂ layer thickness and Al thickness is normalized film thickness H/λ.

Figure 17A:
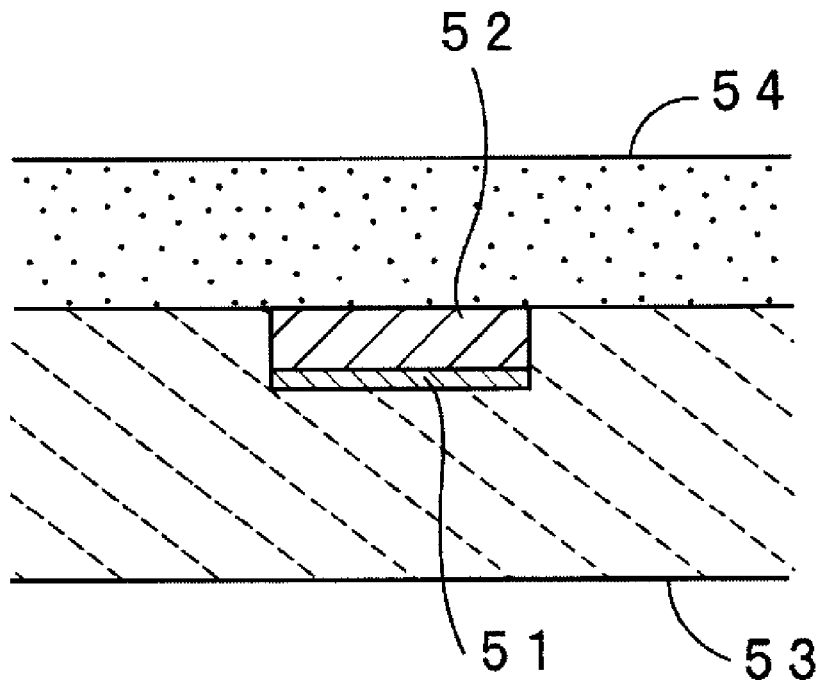
FIGS. 17A and 17B are partially notched cross-sectional views showing the structure of the IDT electrode having a multilayer structure including an electrode layer composed primarily of Al and an electrode whose electric power resistance is greater than that of Al.
Figure 17B:
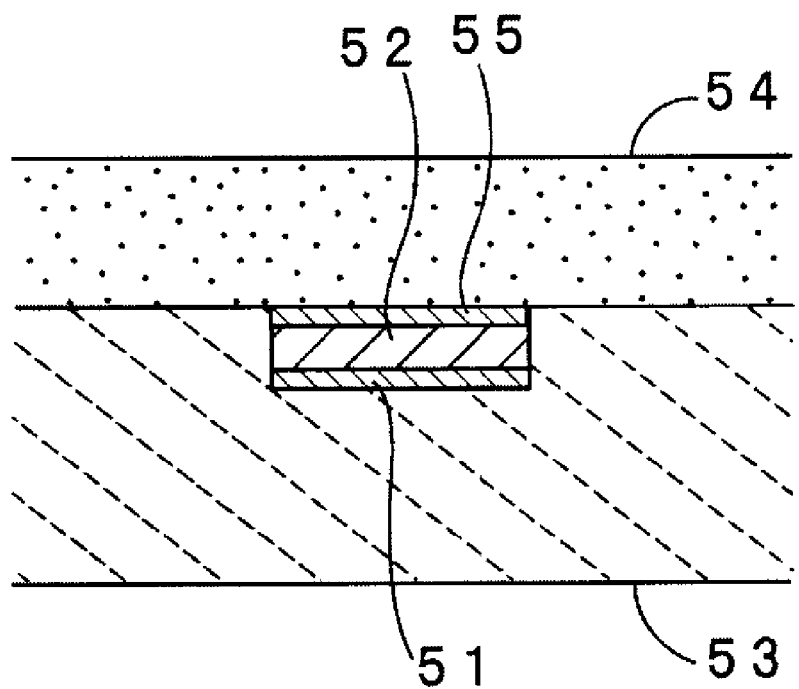

In addition, in preferred embodiments of the present invention, the IDT electrode preferably includes a multilayer structure including an electrode layer composed primarily of Al and an electrode whose electric power resistance is greater than that of Al. FIGS. 17A and 17B are partially notched cross-sectional views of the IDT electrode having such a multilayer structure.

In FIG. 17A, an electrode layer 52 composed primarily of Al is disposed on a Ti electrode layer 51 with a thickness of about 50 nm, which defines the electrode whose electric power resistance is greater than that of Al. Here, the thickness of the electrode layer 52 is thicker than that of the Ti electrode layer 51, and the upper surface of this electrode layer 52 is substantially flush with the upper surface of a substrate 53. In addition, a SiO₂ layer 54 is arranged so as to over the substrate 53 and the IDT electrode.

Moreover, in FIG. 17B, the electrode layer 52 composed primarily of Al is formed on the Ti electrode layer 51 with a thickness of about 50 nm, which defines a second electrode whose density is greater than that of Al. Further, another second electrode layer 55 made of Ti with a film thickness of about 50 nm is formed on the first electrode layer 52. The upper surface of the second electrode layer 55 is substantially flush with the upper surface of the substrate 53. The IDT electrode may also be composed of a laminated film in which, two or more electrode layers are laminated. Moreover, as is clear from the present preferred embodiment, in the laminated layer, the second electrode layer whose density is greater than that of Al, laminated on the first electrode layer made of Al or an alloy composed primarily of Al, is not always required to be a single layer, rather it may be a plurality of layers. Furthermore, when a plurality of layers of second electrode layers are use, the first electrode layer may be sandwiched between the plurality of the second electrode layers as the present preferred embodiment, or the second electrode layers may be laminated on only one side of the first electrode layer.

As shown in FIGS. 17A and 17B, by providing the IDT electrode with the lamination film including the first electrode layer composed of Al or primarily of Al and the second electrode layer whose density is greater than that of Al, the bonding strength between the IDT electrode and a piezoelectric substrate is improved, and the degradation of the IDT electrode due to a stress migration is prevented, thus improving the electric power resistance of the IDT electrode.

In addition, in FIG. 17B, although the second electrode layers 51 and 55 made of Ti are laminated on the upper and lower sides of the first electrode layer 52 composed of Al or primarily of Al, a structure in which the second electrode layer made of Ti is sandwiched by a pair of the first electrode layer 52 composed of Al or primarily of Al, may also be used. In such a case, the electric power resistance is also improved. Moreover, by alternately laminating the first electrode layer composed of Al or primarily of Al and the second electrode layer, an IDT electrode having a multilayer structure with four or more layers may also be obtained.

In addition, in FIGS. 17A and 17B, although a second electrode layer made of Ti is shown, another metal, such as Cu, W, and Cr, whose density is greater than that of Al may also be used. Moreover, an alloy, such as AlCu, including Al and a metal whose density is greater than that of Al, may also be used.

Furthermore, an alloy, such as NiCr, composed primarily of a plurality of metals whose density is greater than that of Al, may also be used. In these cases, similar effects as the above preferred embodiment are obtained.

Figure 18:
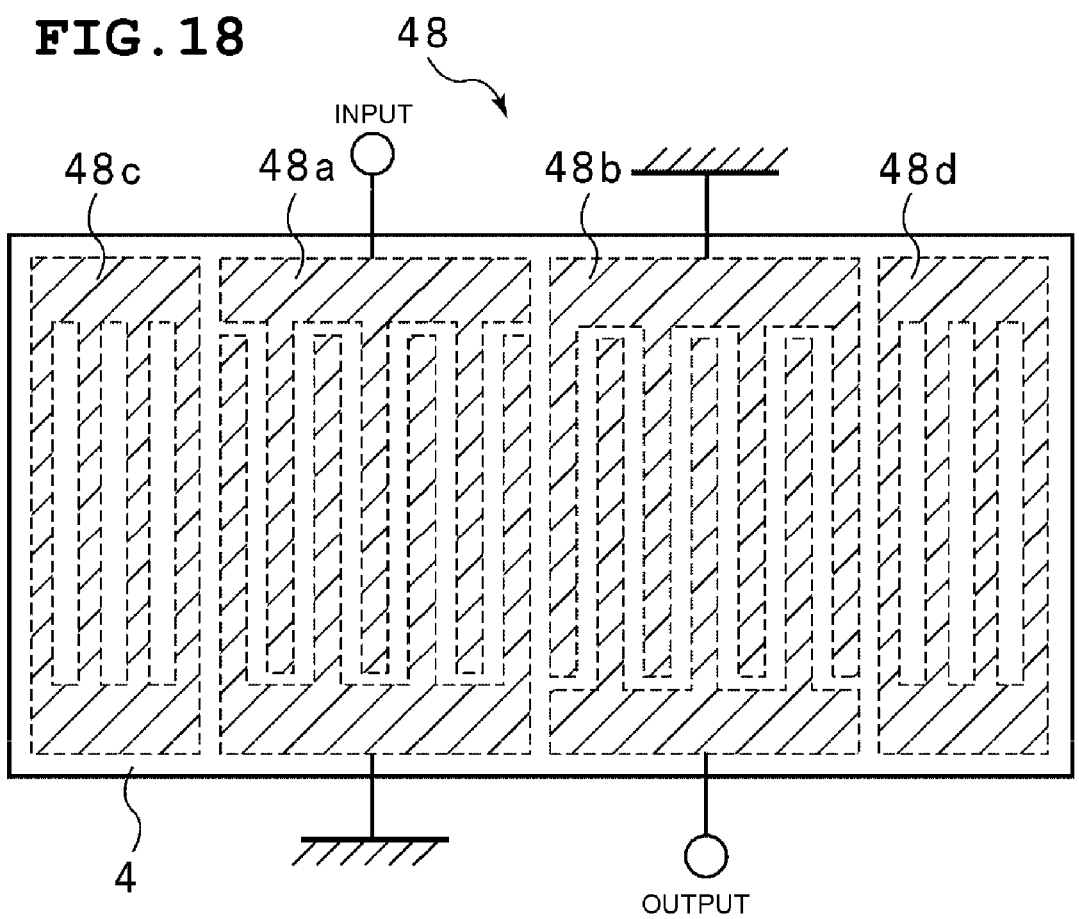
FIG. 18 is a schematic plan view showing the electrode structure of a two-port-type surface acoustic wave resonator according to another preferred embodiment of the present invention.

The present invention is applicable to various surface acoustic wave devices. An example of such surface acoustic wave devices is shown in FIG. 18. FIG. 18 is a schematic plan view showing a 2-port-type surface acoustic wave resonator 48. Here, IDTs 48a and 48b, and reflectors 48c and 48d are provided on a piezoelectric substrate. Moreover, with an electrode structure substantially the same as that of the 2-port-type surface acoustic wave resonator 48 shown in FIG. 18, a vertical coupling type surface acoustic wave resonator filter may be provided.

Figure 19:
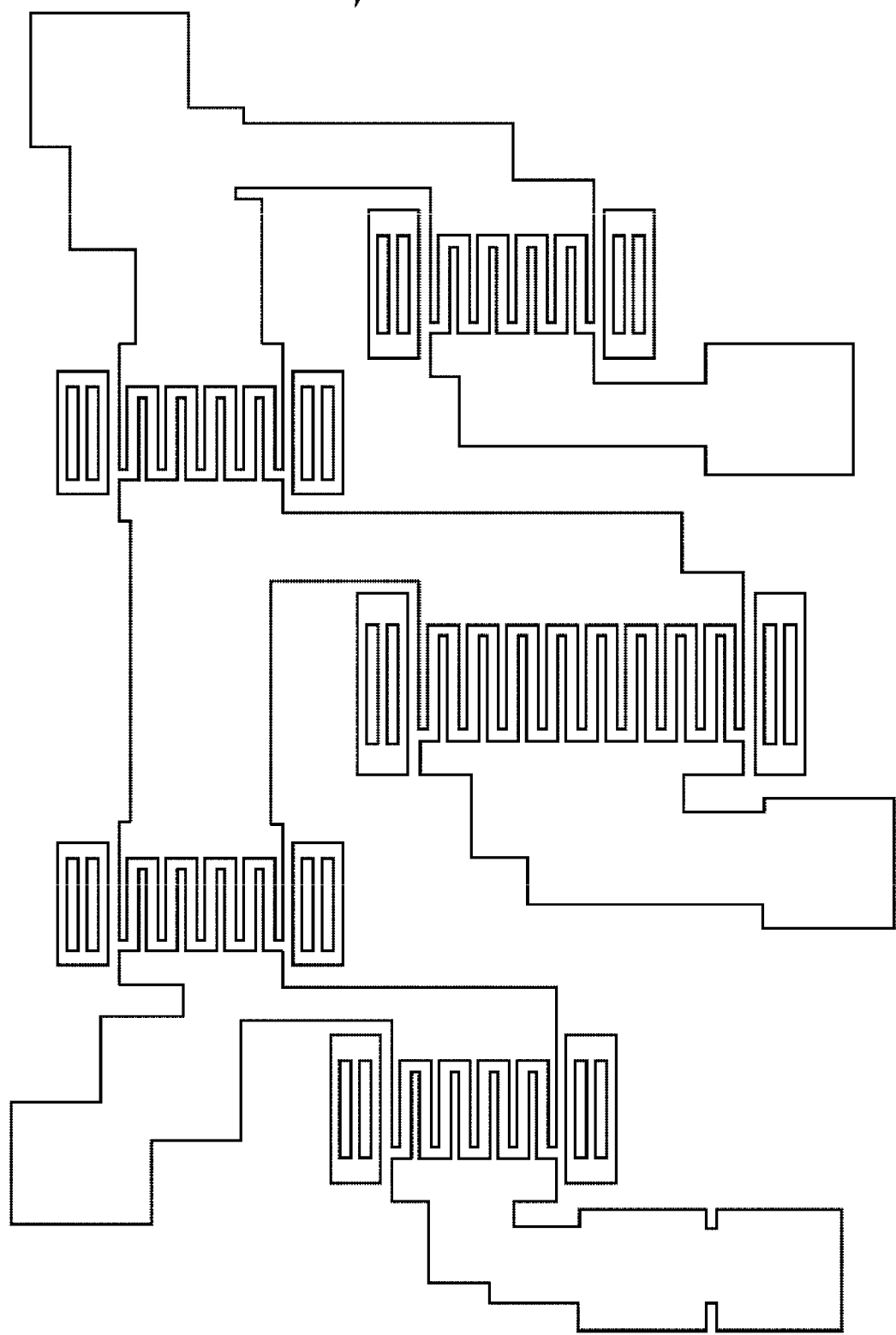
FIG. 19 is a schematic plan view showing the electrode structure of a ladder-type filter according to a further preferred embodiment of a surface acoustic wave device according to the present invention.
Figure 20:
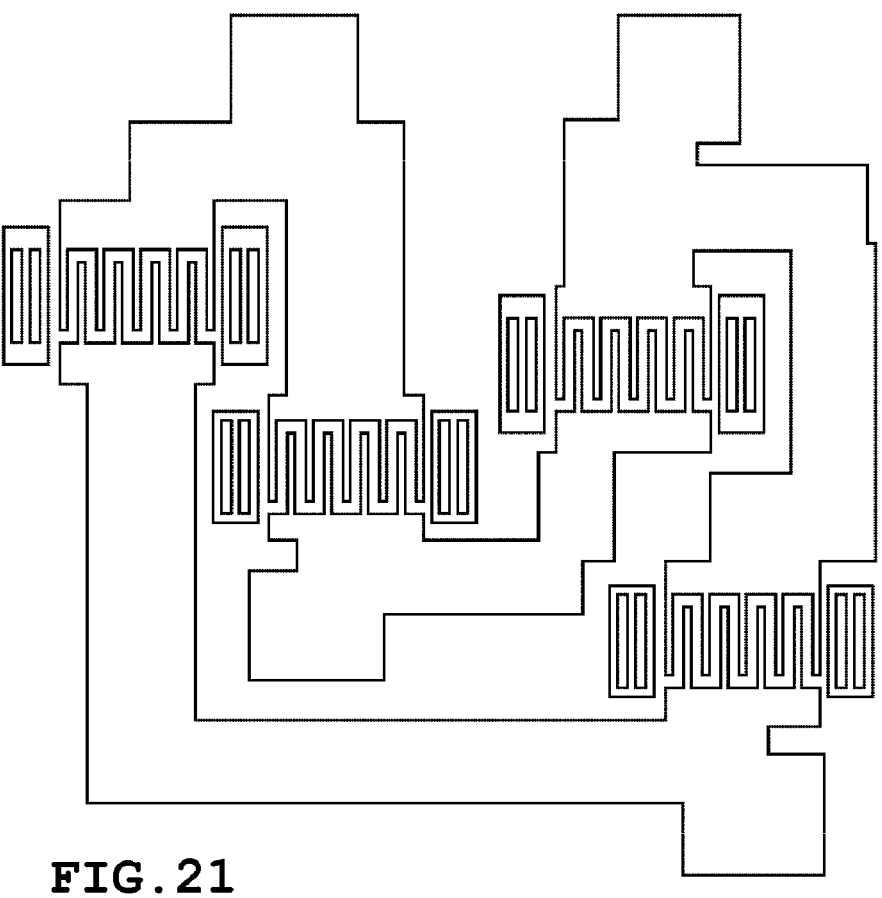
FIG. 20 is a schematic plan view showing the electrode structure of a lattice-type surface acoustic wave filter according to a further preferred embodiment of a surface acoustic wave device according to the present invention.

Further, FIGS. 19 and 20 are schematic plan views showing the electrode structures of a ladder type filter and a lattice type filter, respectively. By providing an electrode structure such as those of the ladder type filter 49a and the lattice type filter 49b shown in FIGS. 19 and 20, a ladder type filter and a lattice type filter may be provided according to preferred embodiments of the present invention.

However, the present invention is applicable not only to the surface acoustic wave devices with the electrode structures shown in FIGS. 18 to 20, and may also be applied to various types surface acoustic wave devices.

Moreover, in the surface acoustic wave device according to preferred embodiments of the present invention, preferably, a surface acoustic wave device using a leaky acoustic wave is provided. In Japanese Unexamined Patent Publication No. 06-164306, a surface acoustic wave device with an electrode made of a heavy metal such as Au, using a Love wave without propagation attenuation is disclosed. Here, by using a heavy metal as an electrode, the sonic velocity of the surface acoustic wave is less than that of a traverse bulk wave of the substrate, thereby, the leakage component is eliminated, resulting in utilization of the Love wave as a surface acoustic wave without leakage.

In the surface acoustic wave device according to preferred embodiments of the present invention, an IDT electrode is formed by filling an electrode material into a plurality of grooves provided in a piezoelectric substrate. Here, preferably, the internal angles of the grooves are to be equal to or less than about 90°, and more preferably, to be within the range of about 50° to about 80°. This will be described with reference FIGS. 21 and 22.

Figure 21:
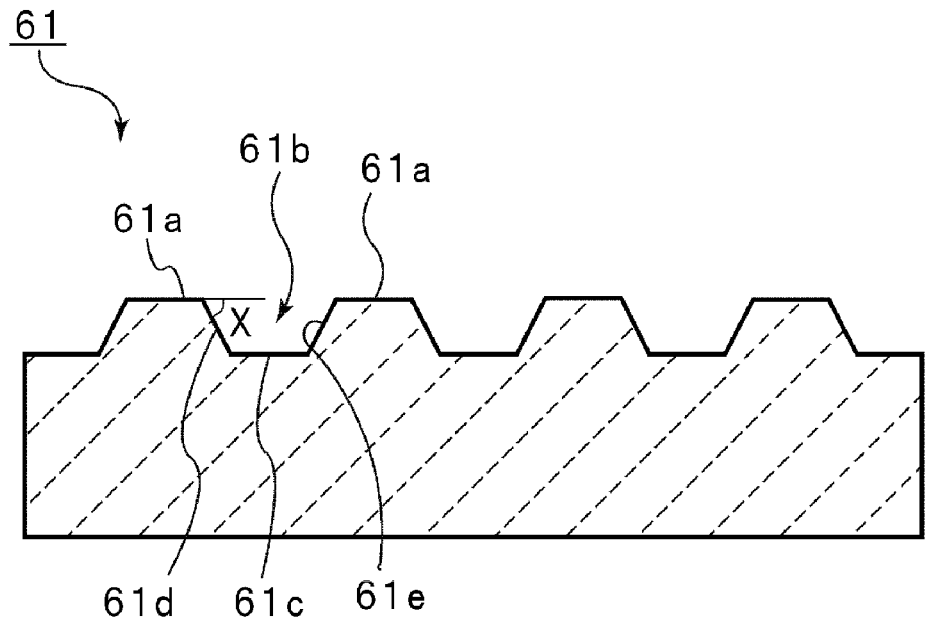
FIG. 21 is a schematic front cross-sectional view for explaining the internal angle of a groove in a surface acoustic wave according to preferred embodiments of the present invention.

FIG. 21 is a schematic front cross-sectional view of the internal angle of the grooves provided in the piezoelectric substrate. In other words, a plurality of grooves 61b are formed in the upper surface 61a of the piezoelectric substrate 61. Each of the grooves 61b is surrounded by the inner bottom surface 61c thereof and a pair of internal surfaces 61d and 61e extending between the inner bottom surface 61c and the upper surface 61a thereof. An IDT electrode 3, for example, as shown in FIG. 1E, is formed by filling inside the grooves 61b with a metal. Here, the internal angle X of the grooves 61b, is defined as an angle between the upper surface 61a of the piezoelectric substrate 61, and the inner side face 61d or 61e, and is an angle located in each of the grooves 61b. In addition, in the piezoelectric substrate 1 shown in FIG. 1E, the internal angle of the grooves is about 90°. In FIG. 21, as shown there, the internal angle X is equal to or less than about 90°.

Figure 22:
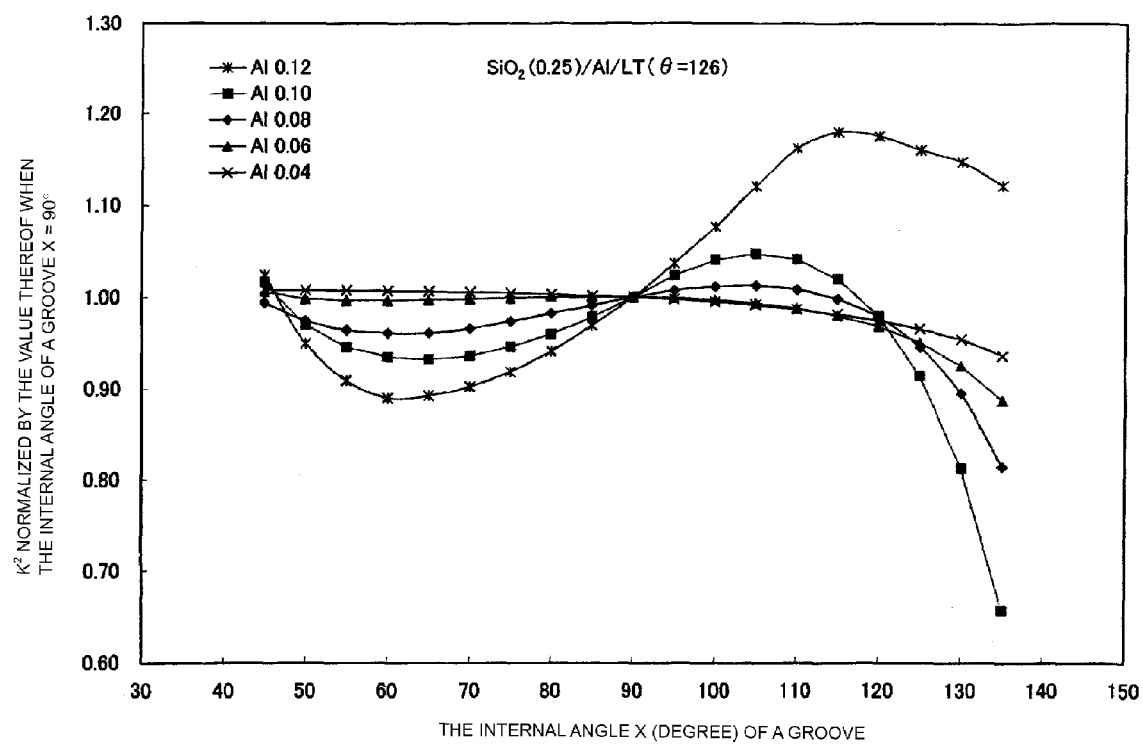
FIG. 22 is a view showing the change of the electromechanical coupling coefficient normalized by the electromechanical coupling coefficient when the internal angle X of grooves is about 90°, when the internal angle of the grooves of the surface acoustic wave and the normalized film thickness of the electrode made of Al defining the IDT electrode are changed.

FIG. 22 shows the change of the electromechanical coupling coefficient in a similar manner as that of the first preferred embodiment. However, in this case IDT electrodes with various thicknesses are provided in grooves with various internal angles in a $LiTaO_3$ substrate.

The vertical axis in FIG. 22 indicates the value of electromechanical coupling coefficient $K^2$ normalized on the basis of the value of the electromechanical coupling coefficient when the internal angle of the groove is about 90°. The electromechanical coupling coefficient $K^2$ is required to be equal to or greater than about 0.04. On the other hand, in the surface acoustic wave device of the above-mentioned preferred embodiment when the internal angle of grooves is about 90°, the electromechanical coupling coefficient is preferably about 0.05. Therefore, if the electromechanical coupling coefficient in FIG. 22 is equal to or greater than about 0.8, the electromechanical coupling coefficient is equal to or greater than about 0.04. As shown in FIG. 22, if the inner angle of the grooves is within the range of about 45° to about 90°, that is equal to or less than about 90°, within the range of about 0.04 to about 0.12 of the normalized film thickness of Al, the electromechanical coupling coefficient is equal to or greater than about 0.87 regardless of the film thickness. Thereby, a sufficient magnitude of electromechanical coupling coefficient is obtained.

On the other hand, when manufacturing a surface acoustic wave device, fluctuations in the internal angles X of the grooves may occur due to manufacturing tolerances. However, as shown in FIG. 22, when the internal angle of the groove is within the range of equal to or greater than about 90°, a sufficient magnitude of electromechanical coupling coefficient is obtained regardless of the thickness of the IDT electrode. In addition, since the minimum value of the electromechanical coupling coefficient exists when the internal angle of the grooves is in the vicinities of about 60° to about 70°, when the internal angle of the grooves is set in the vicinities of the range corresponding to the minimum, that is about 50° to about 80°, even if fluctuations of the internal angles of the grooves occur, the fluctuations of the electromechanical coupling coefficients are very small. Therefore, fluctuations of properties of a surface acoustic wave device are very small.

In addition, since, even when an IDT electrode is made using an alloy composed primarily of Al, or an IDT electrode composed of a lamination film as described above, the minimum value of the normalized electromechanical coupling coefficient is achieved when the internal angle X of the grooves is in the vicinities of about 60° to about 70°, it is desirable for the internal angle X of the grooves to be equal to or less than about 90°, and more preferably, to be in the range of about 50° to about 80°.

Figure 23:
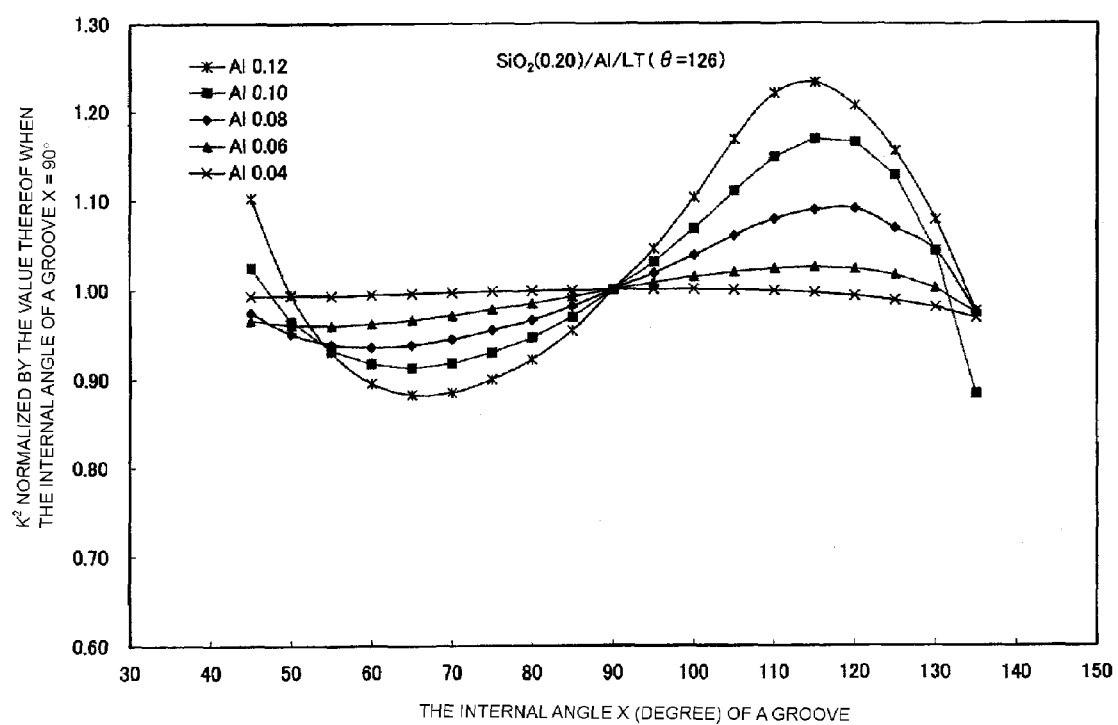
FIG. 23 is a view showing the change of the electromechanical coupling coefficient normalized by the electromechanical coupling coefficient when the internal angle X of grooves is about 90°, when the thickness of the SiO$_2$ layer is about 0.20λ, and the internal angle of the grooves of the surface acoustic wave and the normalized film thickness of the electrode made of Al defining the IDT electrode are changed.

Moreover, FIG. 23 is a view showing the change in electromechanical coupling coefficient $K^2$ when the internal angle of the grooves is changed, obtained in a similar manner as that of in FIG. 22, except that the film thickness of a $SiO_2$ film is changed to about 0.2λ. As shown in FIG. 23, even when the normalized film thickness of the $SiO_2$ film is changed to about 0.2, similar tendencies as those shown in FIG. 22 are maintained, and the fluctuations of the electromechanical coupling coefficients $K^2$ are small within the range of about 50° to about 80° of the internal angles of grooves.

Figure 24:
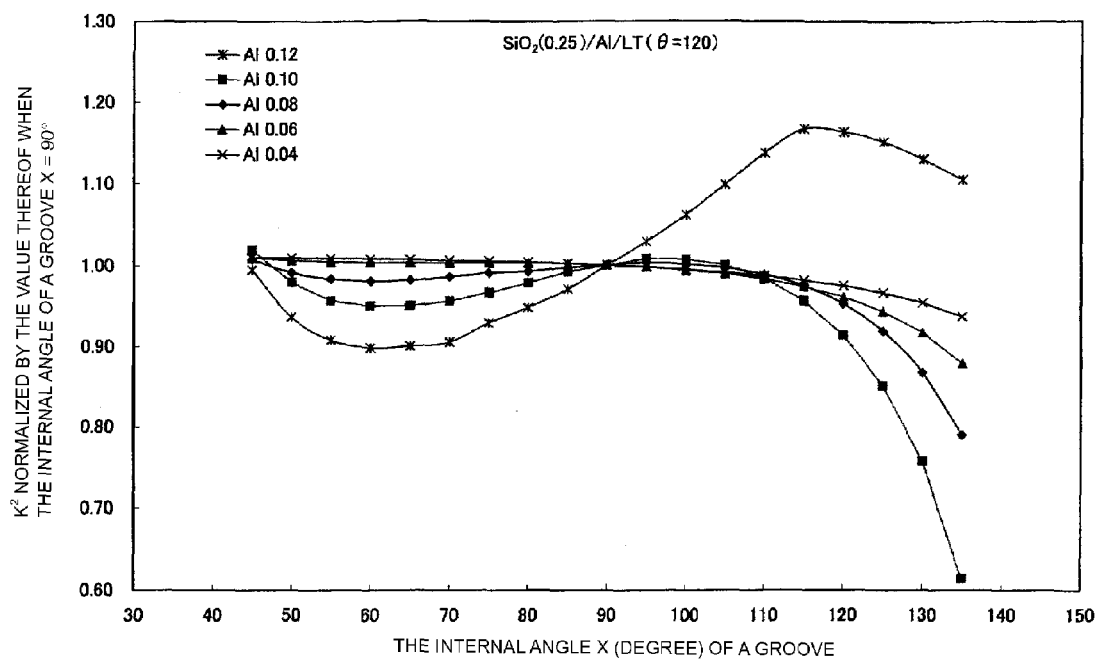
FIG. 24 is a view showing the change of the electromechanical coupling coefficient normalized by the electromechanical coupling coefficient when the internal angle X of grooves is about 90°, when θ=120°, and the internal angle of the grooves of the surface acoustic wave and the normalized film thickness of the electrode made of Al defining the IDT electrode are changed.

FIG. 24 is a view showing the relationship between the internal angle and the electromechanical coupling coefficient $K^2$ obtained in a similar manner as that in FIG. 22, except that θ of the Euler angle is changed from about 126° to about 120°. As shown in FIG. 24, even when the θ of the Euler angle is changed, within the range of about 50° to about 80° of the internal angles of grooves, where similar tendency as that of in FIG. 22 is shown, fluctuations in the electromechanical coupling coefficients $K^2$ are relatively small.

Figure 25:
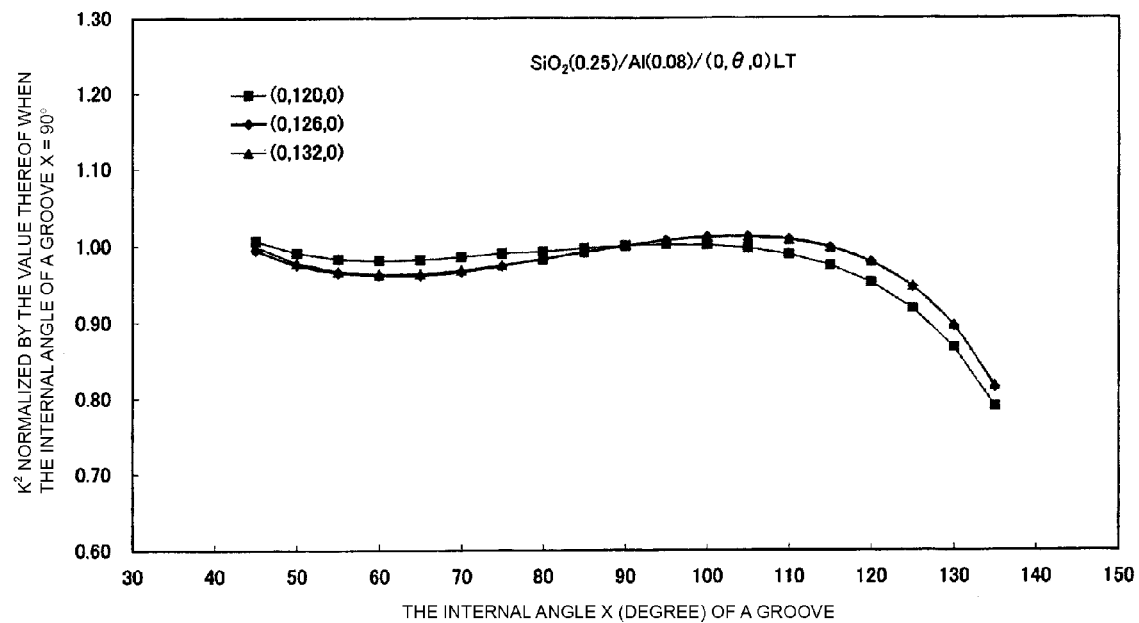
FIG. 25 is a view showing the change of the electromechanical coupling coefficient normalized by the electromechanical coupling coefficient when the internal angle X of grooves is about 90°, when the normalized film thickness of the electrode made of Al is about 0.08, and the internal angle of the grooves of the surface acoustic wave and the normalized film thickness of the electrode made of Al defining the IDT electrode are changed.

FIG. 25 is a view showing the change of the electromechanical coupling coefficient with respect to the internal angle of grooves, when the film thickness of the IDT is fixed and the θ of the Euler angle is about 120°, about 126°, and about 132°. In FIG. 25, similar tendencies as those of in FIG. 22 are also shown, and when the internal angles of grooves is within the range of about 50° to about 80°, even if the θ of the Euler angle fluctuates, fluctuations in the electromechanical coupling coefficients are very small.

Next, a preferred embodiment of a surface acoustic wave device using a $LiNbO_3$ substrate as a piezoelectric substrate will be described. In a surface acoustic wave resonator shown in FIG. 2, a plurality of surface acoustic wave resonators were produced by varying the Euler angle of the $LiNbO_3$ substrate, the normalized film thickness of an electrode made of Al, and the normalized film thickness of a $SiO_2$ film. Moreover, for comparison, a comparative example of a surface acoustic wave resonator with a similar structure as that of the surface acoustic wave resonator discussed in FIG. 3 as a comparative example was produced using the $LiNbO_3$ substrate.

Figure 26:
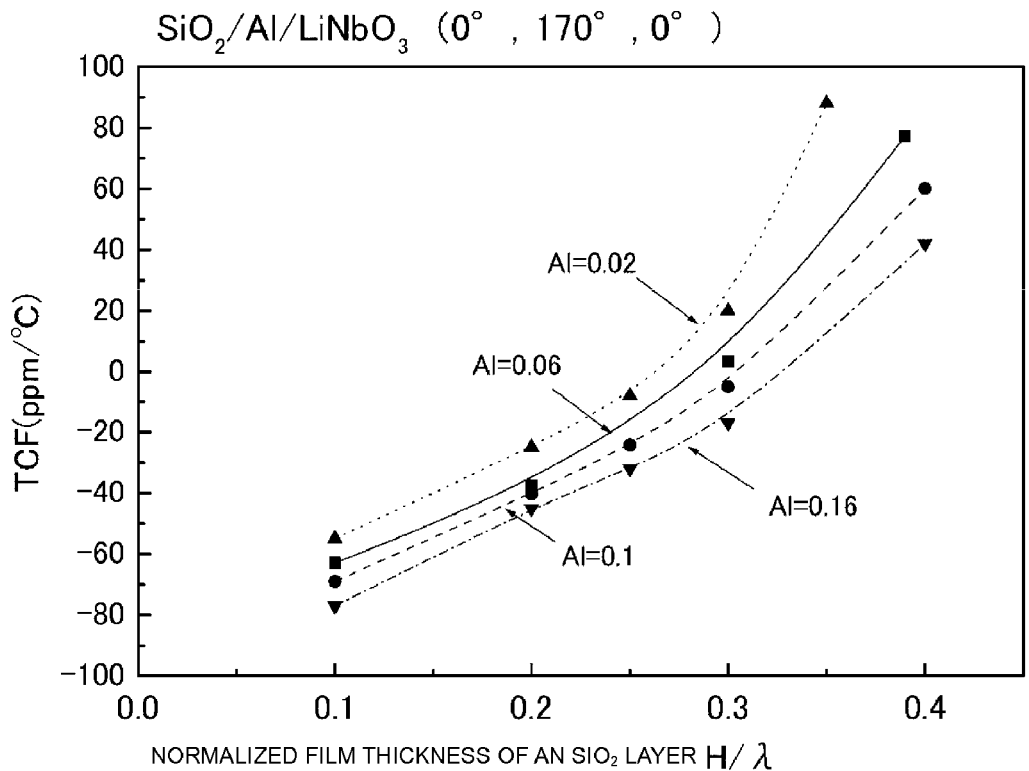
FIG. 26 is a view showing the change of TCF of the surface acoustic wave device of the example when the Euler angle of a LiNbO$_3$ substrate is (0°, 170°, 0°), and the normalized film thickness of SiO$_2$ is changed with respect to the values of the normalized film thickness of the electrode made of Al: 0.02, 0.06, 0.1, and 0.16.

FIG. 26 is a view showing the change of TCF with respect to the normalized film thickness of the $SiO_2$ film, when the Euler angle of the $LiNbO_3$ substrate is (0°, 170°, 0°) and the normalized film thickness of Al is 0.02, 0.06, 0.1, 0.16. As shown in FIG. 26, when the normalized film thickness of the $SiO_2$ film is within the range of about 0.2 to about 0.4, normalized film thicknesses which cause TCF to be within about ±30 ppm/° C. exist. In other words, when the normalized film thickness of the $SiO_2$ film is small, the normalized film thickness of Al should also be small, and when the normalized film thickness of the $SiO_2$ film is large, the normalized film thickness of Al should also be large. Moreover, if the normalized film thickness of the $SiO_2$ film is within the range of about 0.25 to about 0.3, the TCF is within the range equal to or less than about ±30 ppm/° C. in the entire range of about 0.02 to about 0.16 of the normalized film thickness of Al. In addition, as for the Euler angle, by setting the normalized film thickness of the $SiO_2$ film in the above-described range, outstanding TCF is obtained.

Figure 27:
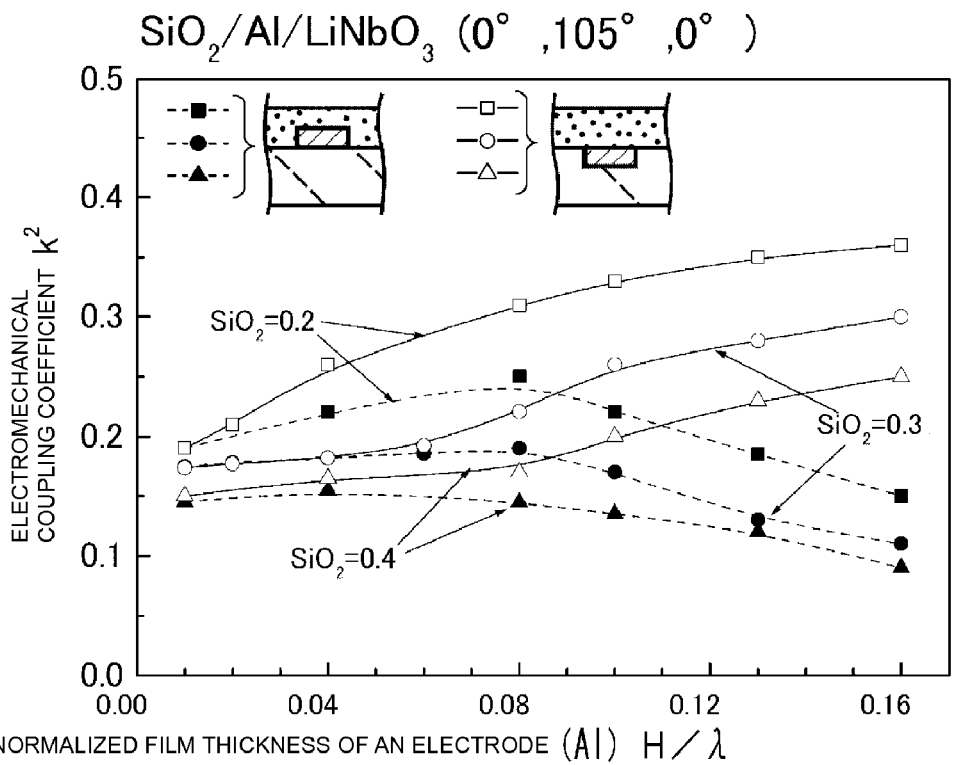
FIG. 27 is a view showing the change of the electromechanical coupling constant $K^2$ of the surface acoustic wave device of the example when the Euler angle of the LiNbO$_3$ substrate is (0°, 105°, 0°), and the normalized film thickness of SiO$_2$ is changed with respect to the values of the normalized film thickness of the electrode made of Al: 0.2, 0.3, and 0.4; and the change of the electromechanical coupling constant $K^2$ of a known surface acoustic wave device under same conditions.

FIG. 27 is a view showing the changes of the electromechanical coupling constant $K^2$ of the above comparative example and that of this preferred embodiment, when the normalized film thickness of Al is changed at various normalized film thicknesses of the $SiO_2$ film when the Euler angle of the $LiNbO_3$ substrate is (0°, 105°, 0°).

Figure 28:
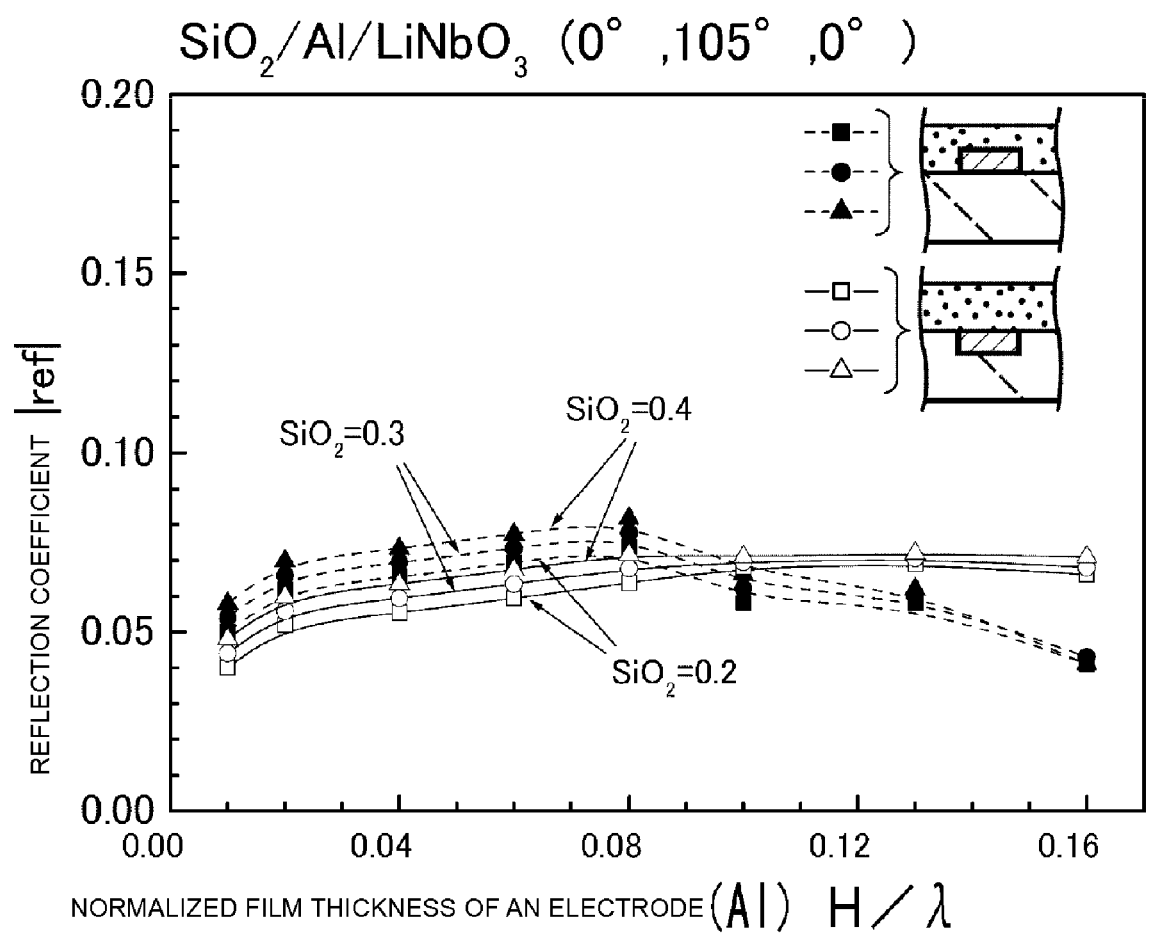
FIG. 28 is a view showing the change of the reflection coefficient of the surface acoustic wave device of the example when the Euler angle of the LiNbO$_3$ substrate is (0°, 105°, 0°), and the normalized film thickness of the electrode changed of Al is changed with respect to the values of the normalized film thickness of the SiO$_2$ layer: 0.2, 0.3, and 0.4; and the change of the reflection coefficient of a known surface acoustic wave device under same conditions.
Figure 29:
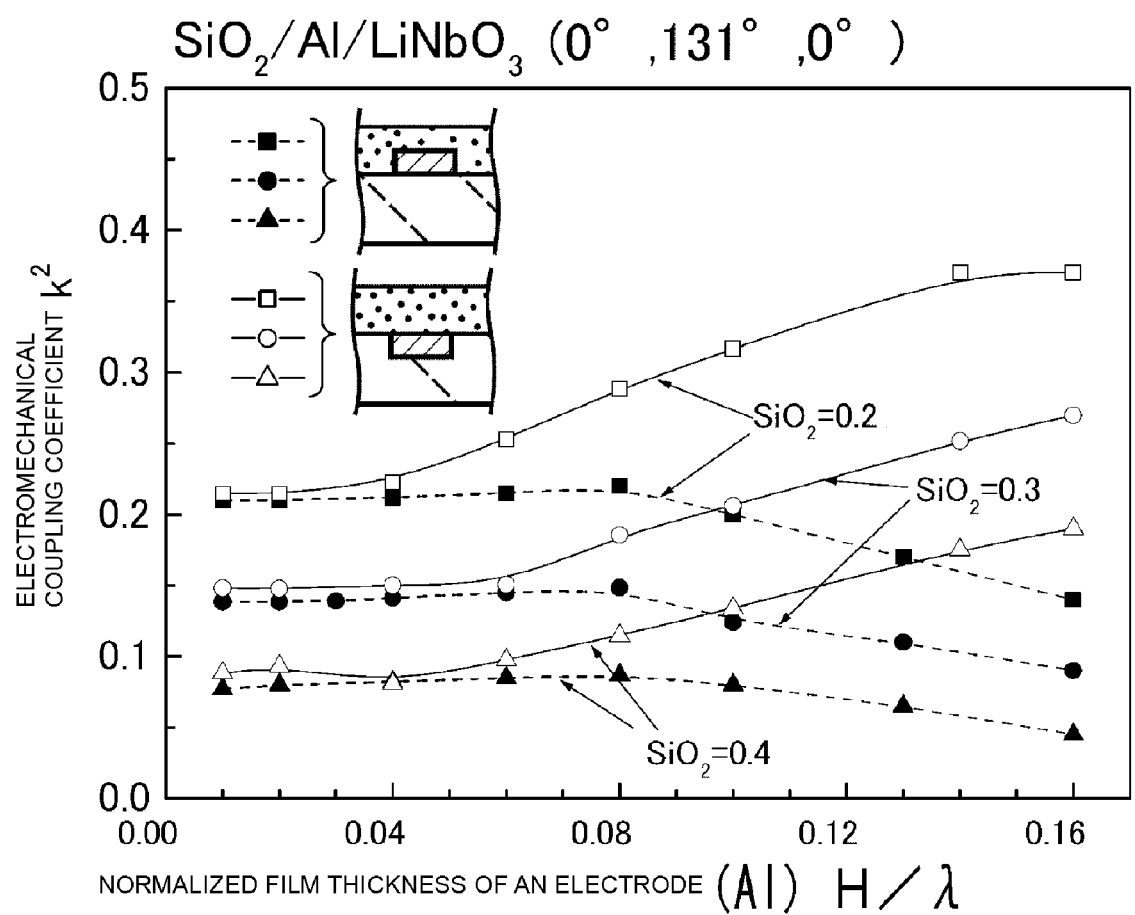
FIG. 29 is a view showing the change of the electromechanical coupling constant $K^2$ of the surface acoustic wave device of the example when the Euler angle of the LiNbO$_3$ substrate is (0°, 131°, 0°), and the normalized film thickness of the electrode made of Al is changed with respect to the values of the normalized film thickness of the SiO$_2$ layer: 0.2, 0.3, and 0.4; and the change of the electromechanical coupling constant $K^2$ of a known surface acoustic wave device under same conditions.
Figure 30:
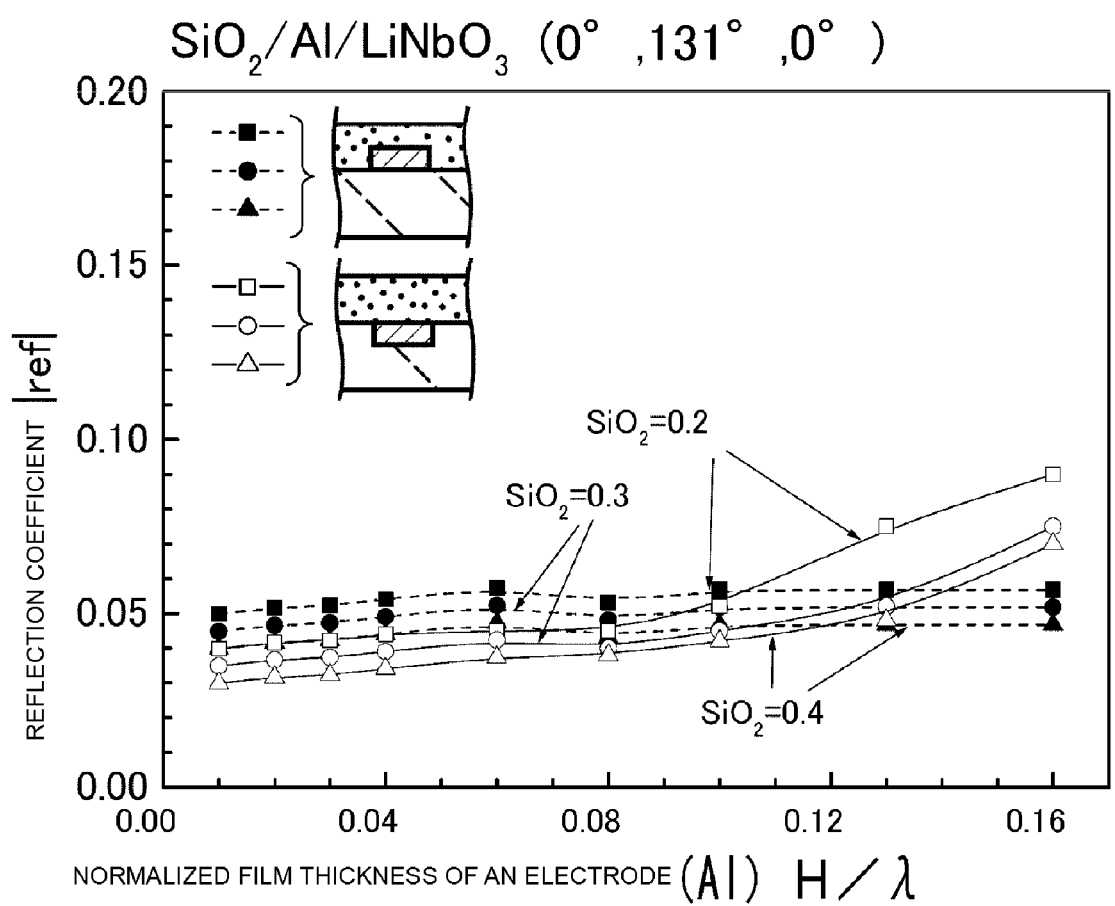
FIG. 30 is a view showing the change of the reflection coefficient of the surface acoustic wave device of the example when the Euler angle of the LiNbO$_3$ substrate is (0°, 131°, 0°), and the normalized film thickness of the electrode made of Al is changed with respect to the values of the normalized film thickness of the SiO$_2$ layer: 0.2, 0.3, and 0.4; and the change of the reflection coefficient of a known surface acoustic wave device under same conditions.
Figure 31:
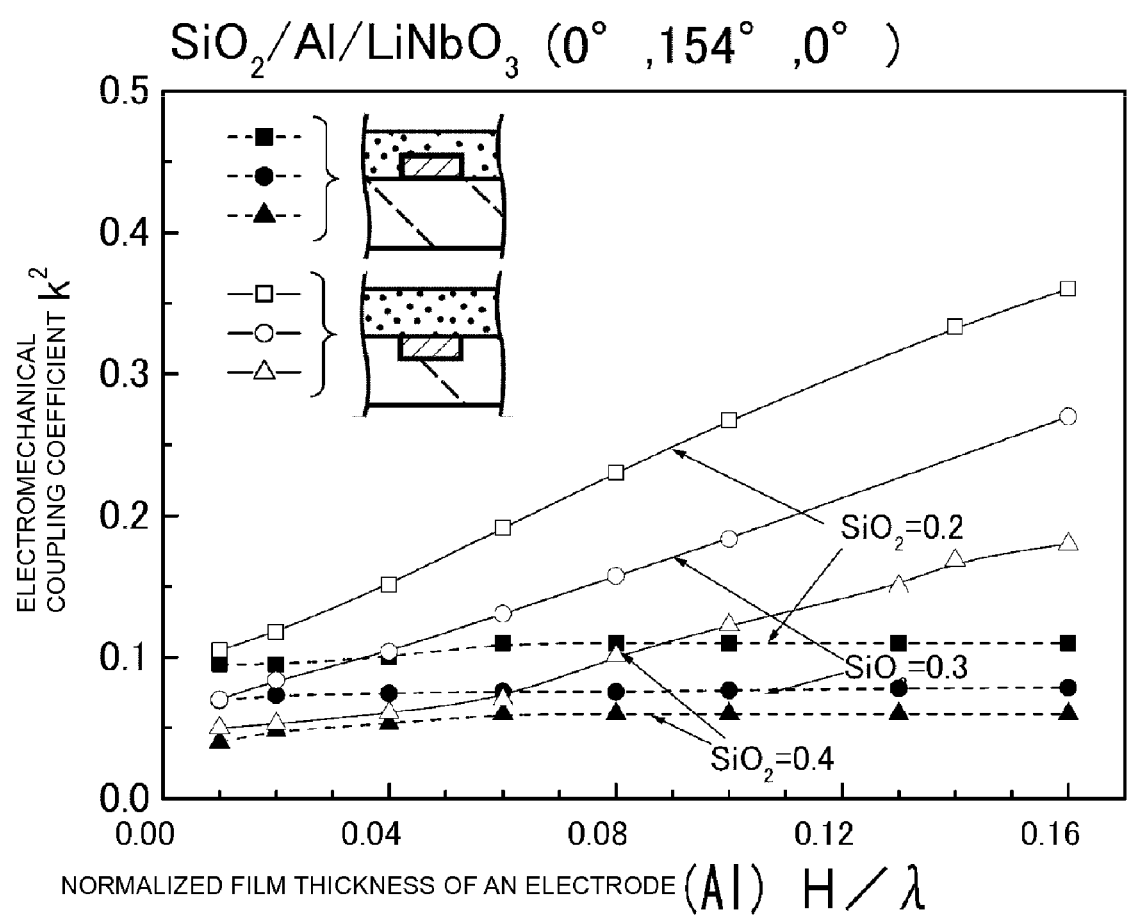
FIG. 31 is a view showing the change of the electromechanical coupling constant $K^2$ of the surface acoustic wave device of the example when the Euler angle of the LiNbO$_3$ substrate is (0°, 154°, 0°), and the normalized film thickness of the electrode made of Al is changed with respect to the values of the normalized film thickness of the SiO$_2$ layer: 0.2, 0.3, and 0.4; and the change of the electromechanical coupling constant $K^2$ of a known surface acoustic wave device under same conditions.
Figure 32:
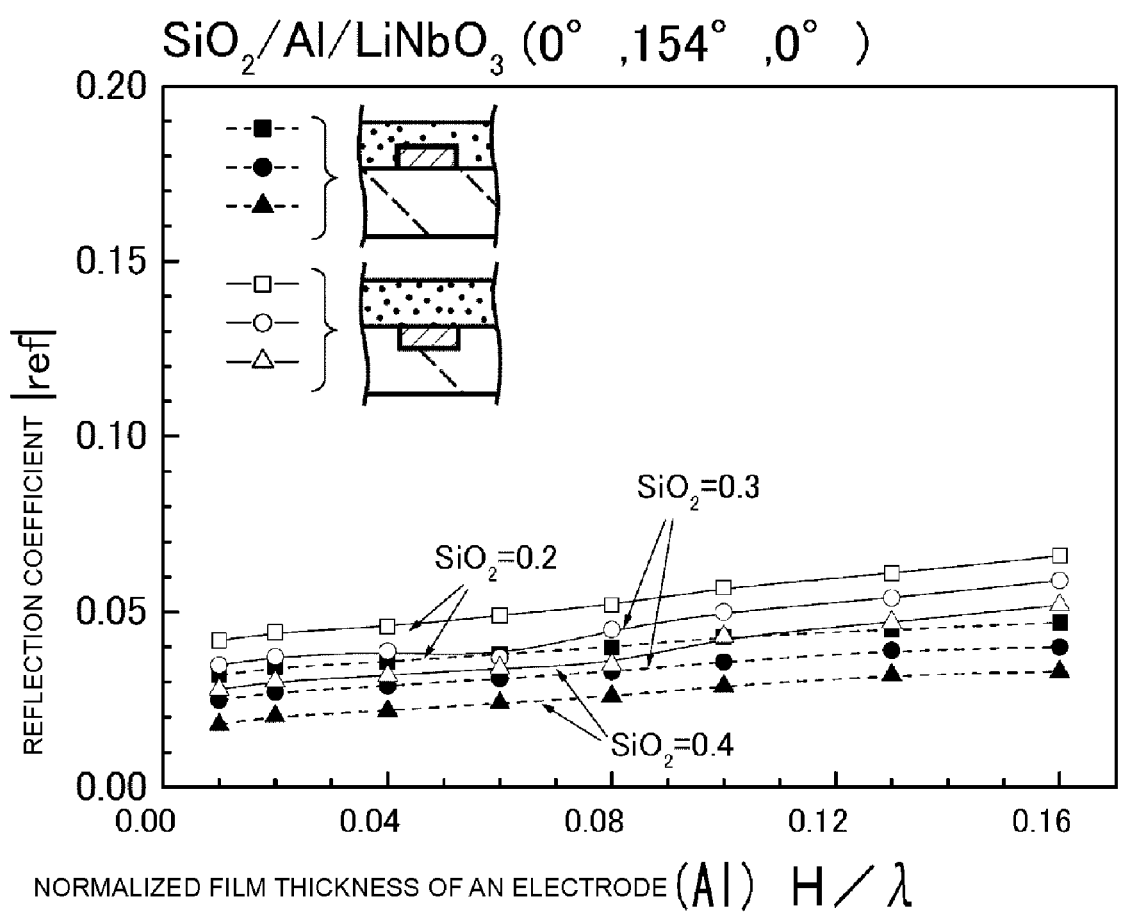
FIG. 32 is a view showing the change of the reflection coefficient of the surface acoustic wave device of the example when the Euler angle of the LiNbO$_3$ substrate is (0°, 154°, 0°), and the normalized film thickness of the electrode made of Al is changed with respect to the values of the normalized film thickness of the SiO$_2$ layer: 0.2, 0.3, and 0.4; and the change of the reflection coefficient of a known surface acoustic wave device under same conditions.
Figure 33:
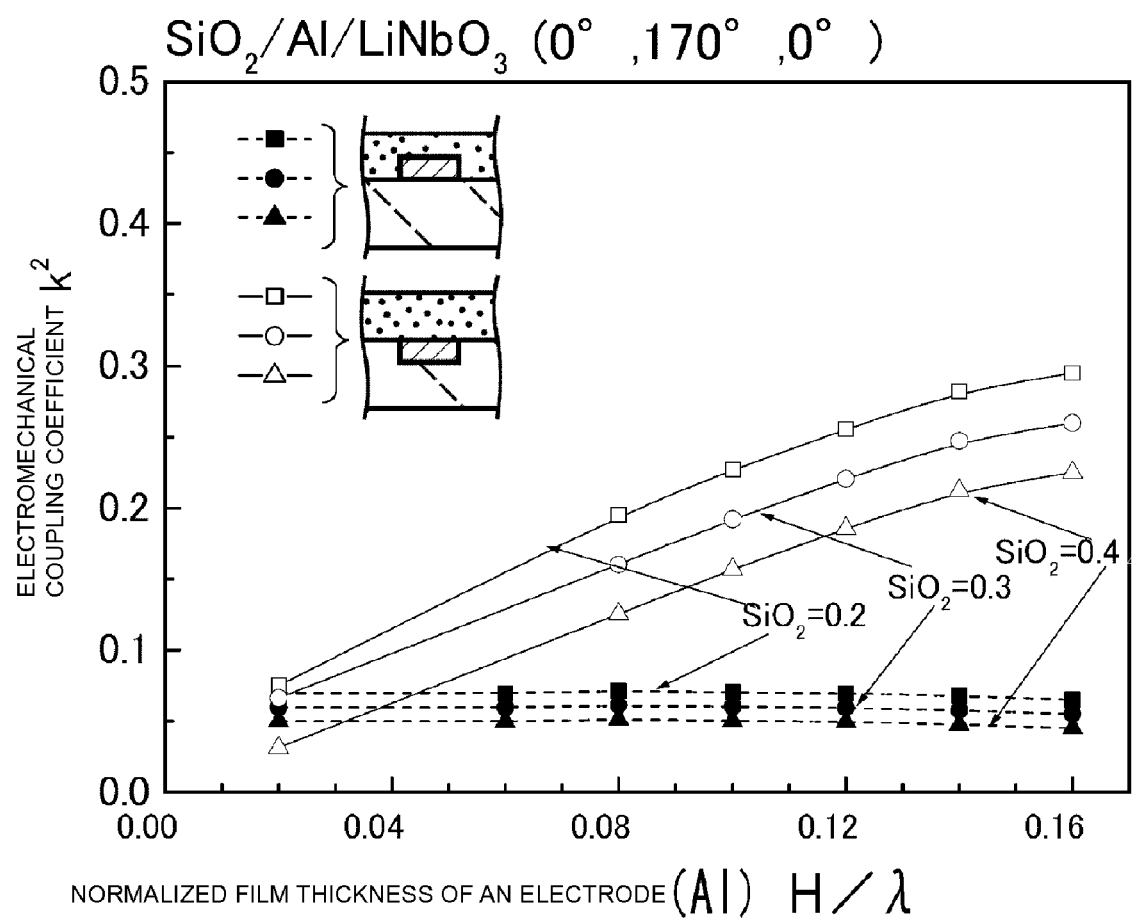
FIG. 33 is a view showing the change of the electromechanical coupling constant $K^2$ of the surface acoustic wave device of the example when the Euler angle of the LiNbO$_3$ substrate is (0°, 170°, 0°), and the normalized film thickness of the electrode made of Al is changed with respect to the values of the normalized film thickness of the SiO$_2$ layer: 0.2, 0.3, and 0.4; and the change of the electromechanical coupling constant $K^2$ of a known surface acoustic wave device under same conditions.
Figure 34:
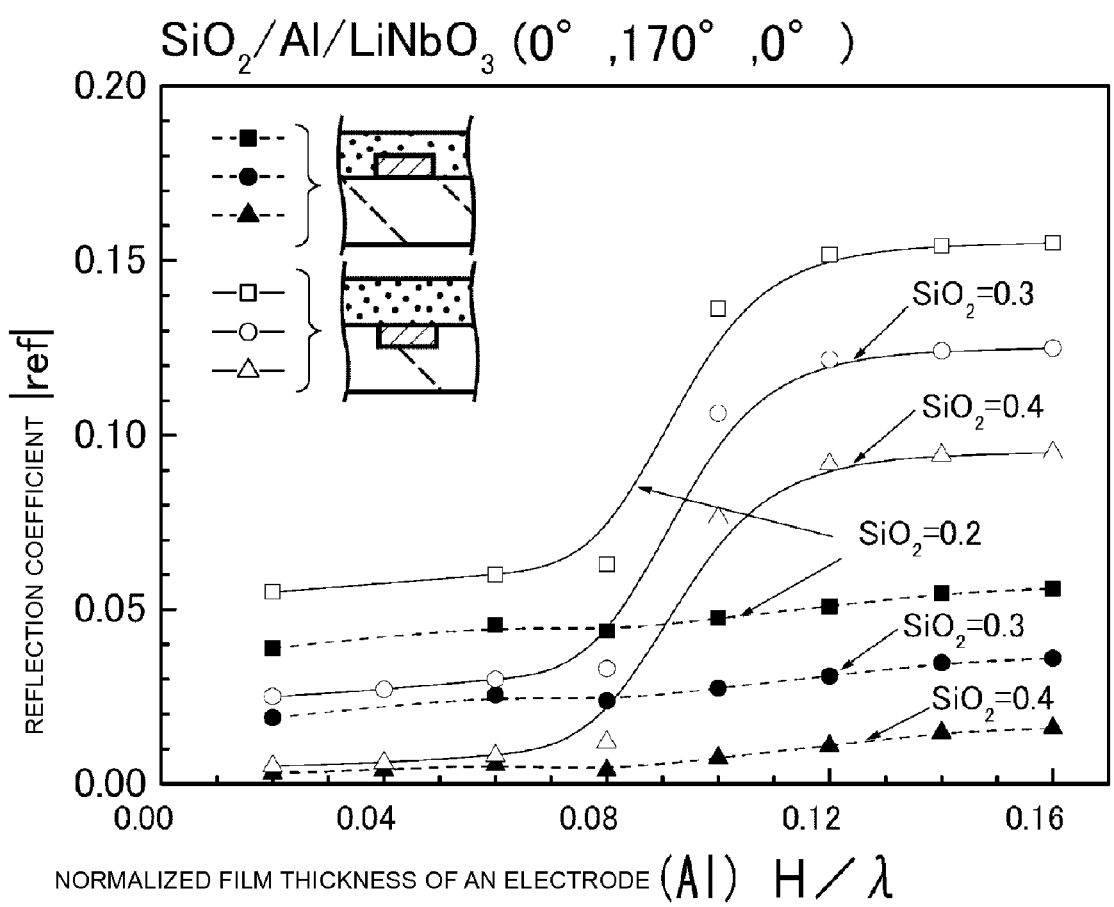
FIG. 34 is a view showing the change of the reflection coefficient of the surface acoustic wave device of the example when the Euler angle of the LiNbO$_3$ substrate is (0°,170°, 0°), and the normalized film thickness of the electrode made of Al is changed with respect to the values of the normalized film thickness of the SiO$_2$ layer: 0.2, 0.3, and 0.4; and the change of the reflection coefficient of a known surface acoustic wave device under same conditions.

Similarly, FIG. 28 is a view showing the change of the reflection coefficients under the same conditions as those of in FIG. 27. Hereinafter, FIGS. 29 and 30, FIGS. 31 and 32, and FIGS. 33 and 34 are views showing the changes of the electromechanical coupling coefficient $K^2$ and the reflection coefficient, respectively, under the same conditions as those of in FIGS. 27 and 2, except that the Euler angle of (0°, 131°, 0°) is used in FIGS. 29 and 30, the Euler angle of (0°, 154°, 0°) is used in FIGS. 31 and 32, and the Euler angle of (0°, 170°, 0°) is used in FIGS. 33 and 34.

According to FIGS. 27, 29, 31, and 33, in the range of normalized film thickness equal to or greater than about 0.04, any one of the electromechanical coupling coefficients $K^2$ of the examples are greater than those of the comparative examples. Moreover, according to FIGS. 28, 30, 32, and 34, the values of reflection coefficients of the preferred embodiments are substantially equal to those of the comparative examples. In particular, since in the range where the normalized film thickness of Al is large, the electromechanical coupling coefficients $K^2$ of the preferred embodiments are sufficiently greater than those of the comparative examples, and the reflection coefficients are also greater than those of the comparative examples, the range is preferable.

When the Euler angle was within the range of (0°, 85° to 120°, 0°), results similar to those shown in FIGS. 27 and 28 were also obtained, and when the Euler angle was within the range of (0°, 90° to 110°, 0°), more preferable results were obtained. Moreover, when the Euler angle was within the range of (0°, 125° to 141°, 0°), results similar to those shown in FIGS. 29 and 30 were also obtained, and when the Euler angle was within the range of (0°, 125° to 136°, 0°), more preferable results were obtained. When the Euler angle was within the range of (0°, 145° to 164°, 0°), results similar to those shown in FIGS. 31 and 32 were also obtained, and when the Euler angle was within the range of (0°, 149° to 159°, 0°), more preferable results were obtained. When the Euler angle was within the range of (0°, 160° to 180°, 0°), results similar to those shown in FIGS. 33 and 34 were also obtained, and when the Euler angle was within the range of (0°, 165° to 175°, 0°), more preferable results were obtained.

In addition, the inventors of preferred embodiments of the present invention confirmed that, in the above surface acoustic wave device of the preferred embodiment using a LiNbO₃ substrate, as a result of varying the internal angle X of the grooves 61b, shown in FIG. 1E, similar to the case of the surface acoustic wave device of the above-mentioned preferred embodiment using the LiNbO₃ substrate, when the internal angle is within the range of about 45° to about 90°, the electromechanical coupling coefficient has a sufficient magnitude, and, more preferably, when the internal angle is set within the range of about 50° to about 80°, the fluctuations of the electromechanical coupling coefficients are very small. In other words, similar to when a LiTaO₃ substrate is used, when a LiNbO₃ substrate is used, they also confirmed that, by setting the internal angle of the above grooves to be within the above-described particular range, the electromechanical coupling coefficients are improved, and the fluctuations of the electromechanical coupling coefficients are very small.

Figure 35:
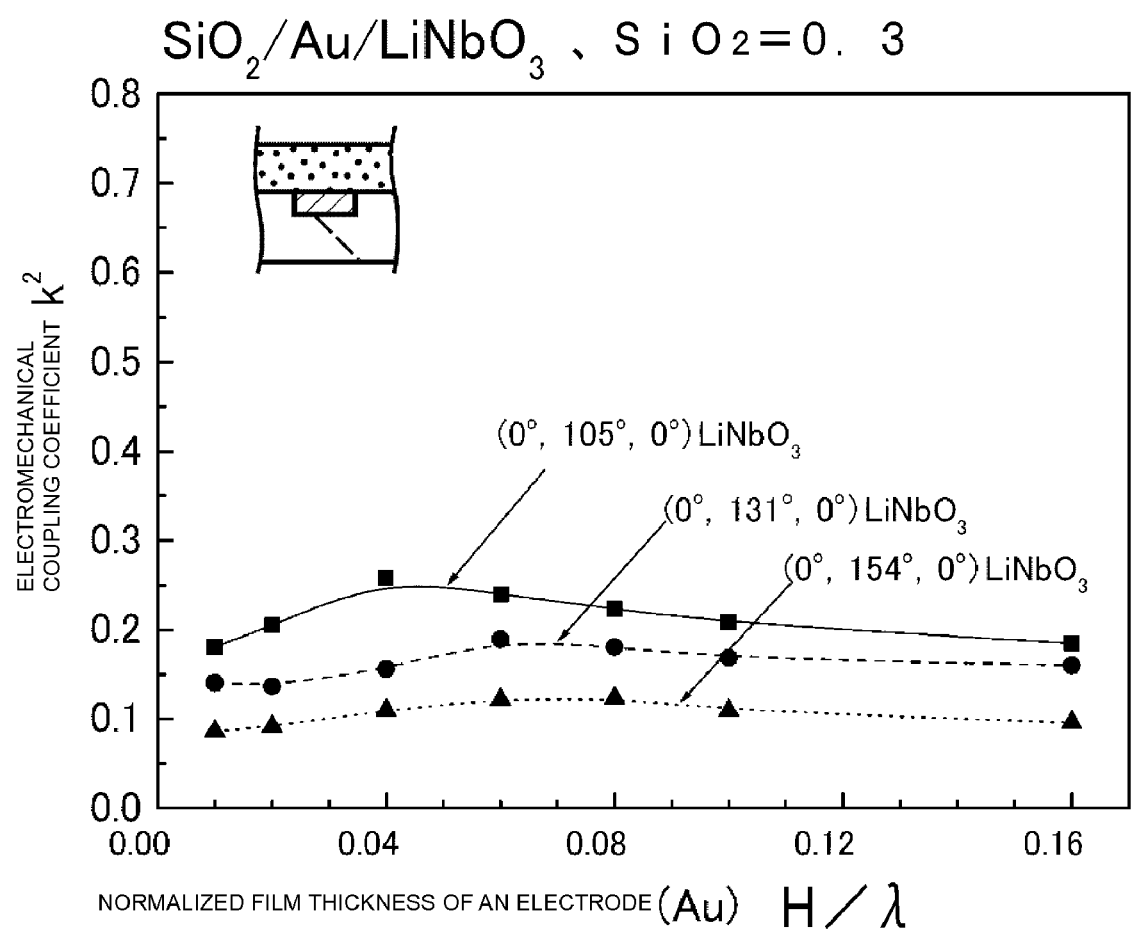
FIG. 35 is a view showing the changes of the electromechanical coupling constant $K^2$ of the surface acoustic wave device of the example when the normalized film thickness of the SiO$_2$ layer is about 0.3, and the Euler angle of the LiNbO$_3$ substrate is changed; and when the normalized film thickness of the SiO$_2$ layer is about 0.3, and the normalized film thickness of an Au electrode is changed.
Figure 36:
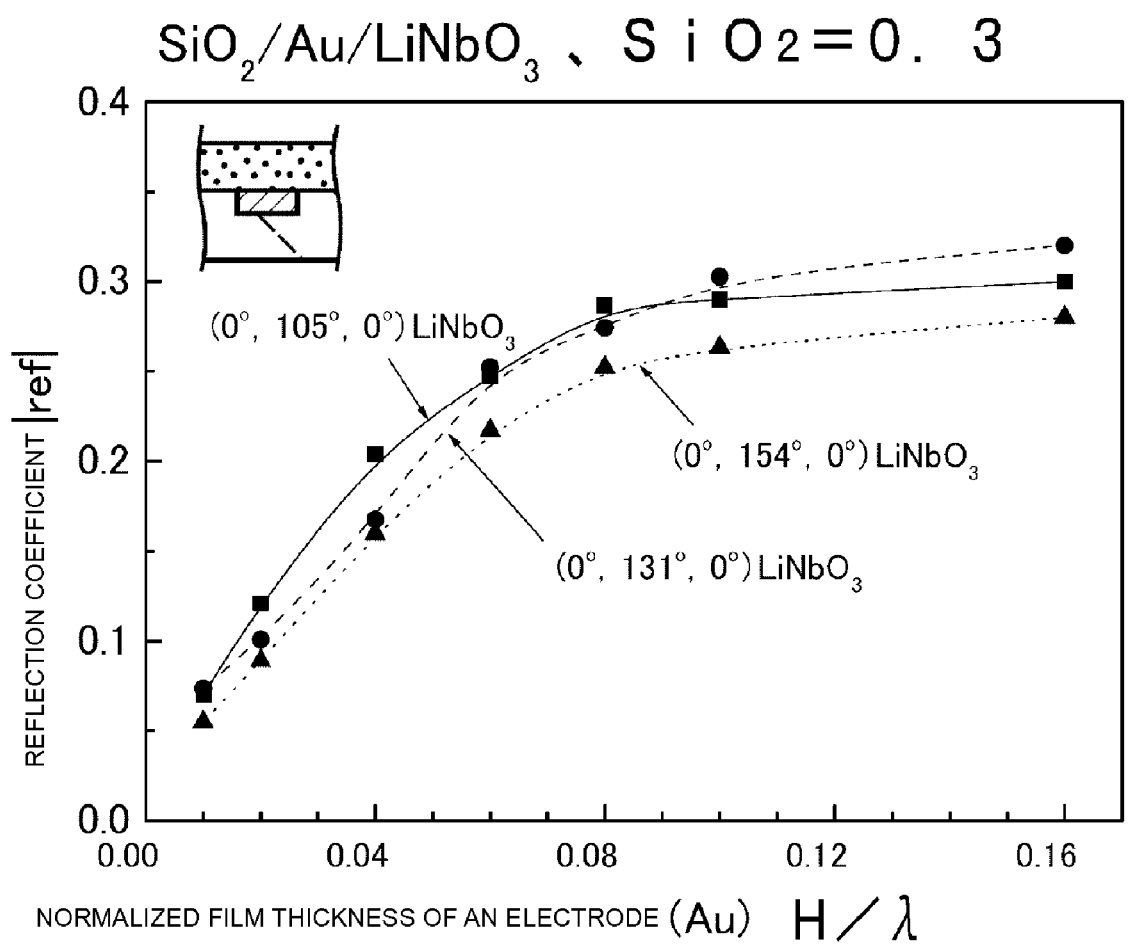
FIG. 36 is a view showing the changes of the reflection coefficient of the surface acoustic wave device of the example when the IDT is made with Au, the normalized film thickness of the SiO$_2$ layer is about 0.3, and the Euler angle of the LiNbO$_3$ substrate is changed; and when the normalized film thickness of the Au electrode is changed.

Moreover, the inventors of preferred embodiments of the present invention investigated metals other than Al for LiNbO₃, and the results are shown in FIGS. 35 and 36. FIG. 35 shows the changes of the electromechanical coupling coefficients $K^2$ in the surface acoustic wave device of the above-described preferred embodiment, when the IDT electrode is made with Au and the normalized film thickness of the SiO₂ thereon is about 0.3, and the Euler angle of the LiNbO₃ substrate is changed, and when the IDT electrode is made with Au and the normalized film thickness of the SiO₂ thereon is about 0.3, and the normalized film thickness of the Au electrode is changed. Moreover, FIG. 36 shows the changes of the reflection coefficients in the surface acoustic wave device of the above-described preferred embodiment, when the IDT electrode is made with Au and the normalized film thickness of the SiO₂ thereon is about 0.3, and the Euler angle of the LiNbO₃ substrate is changed, and when the IDT electrode is made with Au and the normalized film thickness of the SiO₂ thereon is about 0.3, and the normalized film thickness of the Au electrode is changed. In any Euler angle, in addition to the fact that the electromechanical coupling coefficients $K^2$ similar to that of Al is obtained, reflection coefficient greater than that of Al is also obtained. When metals such as Cu, Ni, Mo, Ag, Ta, and W are used, the electromechanical coupling coefficients $K^2$ and reflection coefficients comparable to those of Au are obtained. Thereby, a surface acoustic wave element having a large electromechanical coupling coefficient $K^2$ and a large reflection coefficient is obtained.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A surface acoustic wave device comprising:
   a LiTaO₃ substrate including a plurality of grooves provided in an upper surface thereof; and
   an IDT electrode defined by Al disposed in the grooves provided in the upper surface of the substrate; and
   a SiO₂ layer arranged to cover the LiTaO₃ substrate and the IDT electrode; wherein
   the upper surface of the SiO₂ layer is flattened;
   the Euler angle of the LiTaO₃ substrate is within any one of the ranges provided in the Table below using λ as the wavelength of a surface acoustic wave;
   the film thickness of the IDT electrode is within the range indicated in the Table below that is associated with a corresponding range of the Euler angle of the LiTaO₃ substrate; and the thickness of the SiO₂ layer is within the range indicated in the Table below that is associated with a corresponding range of the film thickness of the IDT electrode:

|  | α = 0.05 or less<br>θ of Euler angle (0, θ, 0) |
|---|---|
| 0.125 <= SiO₂ layer thickness <= 0.20 | |
| 0.02 <= Al thickness < 0.04 | (0, 114° to 142°, 0) |
| 0.04 <= Al thickness < 0.06 | (0, 115° to 143°, 0) |
| 0.06 <= Al thickness < 0.1 | (0, 113° to 145°, 0) |
| 0.1 <= Al thickness < 0.14 | (0, 112° to 146°, 0) |
| 0.20 <= SiO₂ layer thickness <= 0.275 | |
| 0.02 <= Al thickness < 0.04 | (0, 113° to 140°, 0) |
| 0.04 <= Al thickness < 0.06 | (0, 113° to 140°, 0) |
| 0.06 <= Al thickness < 0.1 | (0, 111° to 140°, 0) |
| 0.1 <= Al thickness < 0.14 | (0, 111° to 140°, 0) |
| 0.275 <= SiO₂ layer thickness <= 0.35 | |
| 0.02 <= Al thickness < 0.04 | (0, 111° to 137°, 0) |
| 0.04 <= Al thickness < 0.06 | (0, 111° to 137°, 0) |
| 0.06 <= Al thickness < 0.1 | (0, 109° to 136°, 0) |
| 0.1 <= Al thickness < 0.14 | (0, 107° to 136°, 0) | wherein, SiO₂ layer thickness and Al thickness are each normalized film thickness H/λ.

2. A surface acoustic wave device according to claim 1, wherein
   the Euler angle of the LiTaO₃ substrate is within any one of the ranges provided in the Table shown below;
   the film thickness of the IDT electrode is within the range indicated in the Table below that is associated with a corresponding range of the Euler angle of the LiTaO₃ substrate; and
   the thickness of the SiO₂ layer is within the range indicated in the Table below that is associated with a corresponding range of the film thickness of the IDT electrode:

| | α = 0.025 or less<br>θ of Euler angle (0, θ, 0) |
|---|---|
| 0.125 <= SiO₂ layer thickness <= 0.20 | |
| 0.02 <= Al thickness < 0.04 | (0, 118° to 137°, 0) |
| 0.04 <= Al thickness < 0.06 | (0, 117° to 139°, 0) |
| 0.06 <= Al thickness < 0.1 | (0, 117° to 141°, 0) |
| 0.1 <= Al thickness < 0.14 | (0, 116° to 141°, 0) |
| 0.20 <= SiO₂ layer thickness <= 0.275 | |
| 0.02 <= Al thickness < 0.04 | (0, 115° to 137°, 0) |
| 0.04 <= Al thickness < 0.06 | (0, 115° to 138°, 0) |
| 0.06 <= Al thickness < 0.1 | (0, 115° to 138°, 0) |
| 0.1 <= Al thickness < 0.14 | (0, 114° to 136°, 0) |
| 0.275 <= SiO₂ layer thickness <= 0.35 | |
| 0.02 <= Al thickness < 0.04 | (0, 113° to 137°, 0) |
| 0.04 <= Al thickness < 0.06 | (0, 113° to 137°, 0) |
| 0.06 <= Al thickness < 0.1 | (0, 111° to 136°, 0) |
| 0.1 <= Al thickness < 0.14 | (0, 112° to 133°, 0) | wherein, the SiO₂ layer thickness and Al thickness are each normalized film thickness H/λ.

3. A surface acoustic wave device according to claim 2, wherein the Euler angle of the LiTaO₃ substrate is within any one of the ranges satisfying one of the Euler angles provided in the Table in claim 2 and one of the Euler angles provided in the Table shown below:

| | α = 0.05 or less<br>θ of Euler angle (0, θ, 0) |
|---|---|
| 0.125 <= SiO₂ layer thickness <= 0.20 | |
| 0.02 <= Al thickness < 0.04 | (0, 119° to 152°, 0) |
| 0.04 <= Al thickness < 0.06 | (0, 120° to 153°, 0) |
| 0.06 <= Al thickness < 0.1 | (0, 124° to 158°, 0) |
| 0.1 <= Al thickness < 0.14 | (0, 128° to 155°, 0) |
| 0.20 <= SiO₂ layer thickness <= 0.275 | |
| 0.02 <= Al thickness < 0.04 | (0, 123° to 152°, 0) |
| 0.04 <= Al thickness < 0.06 | (0, 124.5° to 153°, 0) |
| 0.06 <= Al thickness < 0.1 | (0, 123.5° to 154°, 0) |
| 0.1 <= Al thickness < 0.14 | (0, 119° to 157°, 0) |
| 0.275 <= SiO₂ layer thickness <= 0.35 | |
| 0.02 <= Al thickness < 0.04 | (0, 124° to 150°, 0) |
| 0.04 <= Al thickness < 0.06 | (0, 124° to 146°, 0) |
| 0.06 <= Al thickness < 0.1 | (0, 114° to 149°, 0) |
| 0.1 <= Al thickness < 0.14 | (0, 103° to 148°, 0) | wherein the SiO₂ layer thickness and Al thickness are each normalized film thickness H/λ.

4. A surface acoustic wave device according to claim 2, wherein
the Euler angle of the LiTaO₃ substrate is within any one of the ranges satisfying one of the Euler angles provided in the Table of claim 2 and one of the Euler angles provided in the Table shown below:

| | α = 0.25 or less<br>θ of Euler angle (0, θ, 0) |
|---|---|
| 0.125 <= SiO₂ layer thickness <= 0.20 | |
| 0.02 <= Al thickness < 0.04 | (0, 123° to 148°, 0) |
| 0.04 <= Al thickness < 0.06 | (0, 127° to 149°, 0) |
| 0.06 <= Al thickness < 0.1 | (0, 127.5° to 154°, 0) |
| 0.1 <= Al thickness < 0.14 | (0, 132° to 158°, 0) |
| 0.20 <= SiO₂ layer thickness <= 0.275 | |
| 0.02 <= Al thickness < 0.04 | (0, 127° to 148°, 0) |
| 0.04 <= Al thickness < 0.06 | (0, 128° to 149°, 0) |
| 0.06 <= Al thickness < 0.1 | (0, 128° to 149°, 0) |
| 0.1 <= Al thickness < 0.14 | (0, 124° to 155°, 0) |
| 0.275 <= SiO₂ layer thickness <= 0.35 | |
| 0.02 <= Al thickness < 0.04 | (0, 128° to 146°, 0) |
| 0.04 <= Al thickness < 0.06 | (0, 128° to 146°, 0) |
| 0.06 <= Al thickness < 0.1 | (0, 119° to 146°, 0) |
| 0.1 <= Al thickness < 0.14 | (0, 110° to 145°, 0) | wherein the SiO₂ layer thickness and Al thickness are each normalized film thickness H/λ.

5. A surface acoustic wave device according to claim 1, wherein
the Euler angle of the LiTaO₃ substrate is within any one of the ranges satisfying one of the Euler angles provided in the Table of claim 1 and one of the Euler angles provided in the Table shown below:

| | α = 0.05 or less<br>θ of Euler angle (0, θ, 0) |
|---|---|
| 0.125 <= SiO₂ layer thickness <= 0.20 | |
| 0.02 <= Al thickness < 0.04 | (0, 119° to 152°, 0) |
| 0.04 <= Al thickness < 0.06 | (0, 120° to 153°, 0) |
| 0.06 <= Al thickness < 0.1 | (0, 124° to 158°, 0) |
| 0.1 <= Al thickness < 0.14 | (0, 128° to 155°, 0) |
| 0.20 <= SiO₂ layer thickness <= 0.275 | |
| 0.02 <= Al thickness < 0.04 | (0, 123° to 152°, 0) |
| 0.04 <= Al thickness < 0.06 | (0, 124.5° to 153°, 0) |
| 0.06 <= Al thickness < 0.1 | (0, 123.5° to 154°, 0) |
| 0.1 <= Al thickness < 0.14 | (0, 119° to 157°, 0) |
| 0.275 <= SiO₂ layer thickness <= 0.35 | |
| 0.02 <= Al thickness < 0.04 | (0, 124° to 150°, 0) |
| 0.04 <= Al thickness < 0.06 | (0, 124° to 146°, 0) |
| 0.06 <= Al thickness < 0.1 | (0, 114° to 149°, 0) |
| 0.1 <= Al thickness < 0.14 | (0, 103° to 148°, 0) | wherein, the SiO₂ layer thickness and Al thickness are each normalized film thickness H/λ.

6. A surface acoustic wave device according to claim 1, wherein
the Euler angle of the LiTaO₃ substrate is within any one of the ranges satisfying one of the Euler angles provided in the Table in claim 1 and one of the Euler angles provided in the Table shown below:

| | α = 0.25 or less<br>θ of Euler angle (0, θ, 0) |
|---|---|
| 0.125 <= SiO₂ layer thickness <= 0.20 | |
| 0.02 <= Al thickness < 0.04 | (0, 123° to 148°, 0) |
| 0.04 <= Al thickness < 0.06 | (0, 127° to 149°, 0) |
| 0.06 <= Al thickness < 0.1 | (0, 127.5° to 154°, 0) |
| 0.1 <= Al thickness < 0.14 | (0, 132° to 158°, 0) |
| 0.20 <= SiO₂ layer thickness <= 0.275 | |
| 0.02 <= Al thickness < 0.04 | (0, 127° to 148°, 0) |
| 0.04 <= Al thickness < 0.06 | (0, 128° to 149°, 0) |

-continued

| | α = 0.25 or less<br>θ of Euler angle (0, θ, 0) |
|---|---|
| 0.06 <= Al thickness < 0.1 | (0, 128° to 149°, 0) |
| 0.1 <= Al thickness < 0.14 | (0, 124° to 155°, 0) |
| 0.275 <= SiO$_2$ layer thickness <= 0.35 | |
| 0.02 <= Al thickness < 0.04 | (0, 128° to 146°, 0) |
| 0.04 <= Al thickness < 0.06 | (0, 128° to 146°, 0) |
| 0.06 <= Al thickness < 0.1 | (0, 119° to 146°, 0) |
| 0.1 <= Al thickness < 0.14 | (0, 110° to 145°, 0) | wherein the SiO$_2$ layer thickness and Al thickness are each normalized film thickness H/λ.

7. The surface acoustic wave device according to claim 1, wherein an upper surface of the IDT electrode is flush with an upper surface of the LiTaO$_3$ substrate.

8. The surface acoustic wave device according to claim 1, wherein each of the grooves includes a bottom surface and a pair of inner side surfaces extending between a bottom surface and an upper surface of the LiTaO$_3$ substrate, and an internal angle of the grooves, defined by the inner side surfaces and the upper surface of the piezoelectric substrate is within the range of about 45° to about 90°.

9. The surface acoustic wave device according to claim 8, wherein the internal angle of the grooves is within the range of about 50° to about 80°.

10. The surface acoustic wave device according to claim 1, wherein the IDT electrode is provided with a close contact layer composed of Al and a metal or an alloy having a density greater than that of Al.

11. A surface acoustic wave device comprising:
a LiTaO$_3$ substrate including a plurality of grooves provided in an upper surface thereof; and
an IDT electrode defined by Al disposed in the grooves provided in the upper surface of the substrate; and
a SiO$_2$ layer arranged to cover the LiTaO$_3$ substrate and the IDT electrode; wherein
the upper surface of the SiO$_2$ layer is flattened;
the Euler angle of the LiTaO$_3$ substrate is within any one of the ranges provided in the Table shown below using λ as the wave length of a surface acoustic wave;
the film thickness of the IDT electrode is within the range indicated in the Table below that is associated with a corresponding range of the Euler angle of the LiTaO$_3$ substrate; and
the thickness of the SiO$_2$ layer is within the range indicated in the Table below that is associated with a corresponding range of the film thickness of the IDT electrode:

| | α = 0.05 or less<br>θ of Euler angle (0, θ, 0) |
|---|---|
| 0.125 <= SiO$_2$ layer thickness <= 0.20 | |
| 0.02 <= Al thickness < 0.04 | (0, 119° to 152°, 0) |
| 0.04 <= Al thickness < 0.06 | (0, 120° to 153°, 0) |
| 0.06 <= Al thickness < 0.1 | (0, 124° to 158°, 0) |
| 0.1 <= Al thickness < 0.14 | (0, 128° to 155°, 0) |
| 0.20 <= SiO$_2$ layer thickness <= 0.275 | |
| 0.02 <= Al thickness < 0.04 | (0, 123° to 152°, 0) |
| 0.04 <= Al thickness < 0.06 | (0, 124.5° to 153°, 0) |
| 0.06 <= Al thickness < 0.1 | (0, 123.5° to 154°, 0) |
| 0.1 <= Al thickness < 0.14 | (0, 119° to 157°, 0) |

-continued

| | α = 0.05 or less<br>θ of Euler angle (0, θ, 0) |
|---|---|
| 0.275 <= SiO$_2$ layer thickness <= 0.35 | |
| 0.02 <= Al thickness < 0.04 | (0, 124° to 150°, 0) |
| 0.04 <= Al thickness < 0.06 | (0, 124° to 146°, 0) |
| 0.06 <= Al thickness < 0.1 | (0, 114° to 149°, 0) |
| 0.1 <= Al thickness < 0.14 | (0, 103° to 148°, 0) | wherein, the SiO$_2$ layer thickness and Al thickness are each normalized film thickness H/λ.

12. A surface acoustic wave device according to claim 11, wherein
the Euler angle of the LiTaO$_3$ substrate is within any one of the ranges provided in the Table shown below;
the film thickness of the IDT electrode is within the range indicated in the Table below that is associated with a corresponding range of the Euler angle of the LiTaO$_3$ substrate; and
the thickness of the SiO$_2$ layer is within the range indicated in the Table below that is associated with a corresponding range of the film thickness of the IDT electrode:

| | α = 0.25 or less<br>θ of Euler angle (0, θ, 0) |
|---|---|
| 0.125 <= SiO$_2$ layer thickness <= 0.20 | |
| 0.02 <= Al thickness < 0.04 | (0, 123° to 148°, 0) |
| 0.04 <= Al thickness < 0.06 | (0, 127° to 149°, 0) |
| 0.06 <= Al thickness < 0.1 | (0, 127.5° to 154°, 0) |
| 0.1 <= Al thickness < 0.14 | (0, 132° to 158°, 0) |
| 0.20 <= SiO$_2$ layer thickness <= 0.275 | |
| 0.02 <= Al thickness < 0.04 | (0, 127° to 148°, 0) |
| 0.04 <= Al thickness < 0.06 | (0, 128° to 149°, 0) |
| 0.06 <= Al thickness < 0.1 | (0, 128° to 149°, 0) |
| 0.1 <= Al thickness < 0.14 | (0, 124° to 155°, 0) |
| 0.275 <= SiO$_2$ layer thickness <= 0.35 | |
| 0.02 <= Al thickness < 0.04 | (0, 128° to 146°, 0) |
| 0.04 <= Al thickness < 0.06 | (0, 128° to 146°, 0) |
| 0.06 <= Al thickness < 0.1 | (0, 119° to 146°, 0) |
| 0.1 <= Al thickness < 0.14 | (0, 110° to 145°, 0) | wherein the SiO$_2$ layer thickness and Al thickness are each normalized film thickness H/λ.

13. The surface acoustic wave device according to claim 11, wherein an upper surface of the IDT electrode is flush with an upper surface of the LiTaO$_3$ substrate.

14. The surface acoustic wave device according to claim 11, wherein each of the grooves is surrounded by a bottom surface and a pair of inner side surfaces extending between a bottom surface and an upper surface of the LiTaO$_3$ substrate, and an internal angle of the grooves, defined by the inner side surfaces and the upper surface of the piezoelectric substrate is within the range of about 45° to about 90°.

15. The surface acoustic wave device according to claim 14, wherein the internal angle of the grooves is within the range of about 50° to about 80°.

16. The surface acoustic wave device according to claim 11, wherein the IDT electrode is provided with a close contact layer composed of Al and a metal or an alloy having a density greater than that of Al.

17. A surface acoustic wave device comprising:
a LiNbO$_3$ substrate including a plurality of grooves provided in an upper surface thereof; and an IDT electrode which is defined by Al disposed in the grooves provided in the upper surface of the substrate; and a SiO$_2$ layer arranged to cover the LiNbO$_3$ substrate and the IDT electrode; wherein the upper surface of the SiO$_2$ layer is flattened;

λ is used for denoting the wavelength of a surface acoustic wave;

a normalized film thickness of the IDT electrode is within the range of about 0.04 to about 0.16;

a normalized film thickness of the SiO$_2$ layer is within the range of 0.2 to 0.4; and the Euler angle of the LiNbO$_3$ substrate is within any one of the ranges provided in the Table shown below:

| θ of Euler angle (0°, θ, 0°) |
|---|
| (0°, 85° to 120°, 0°) |
| (0°, 125° to 141°, 0°) |
| (0°, 145° to 164°, 0°) |
| (0°, 160° to 180°, 0°). |

18. The surface acoustic wave device according to claim 17, wherein the Euler angle of the LiNbO$_3$ substrate is within any one of the ranges provided in the Table shown below:

| θ of Euler angle (0°, θ, 0°) |
|---|
| (0°, 90° to 110°, 0°) |
| (0°, 125° to 136°, 0°) |
| (0°, 149° to 159°, 0°) |
| (0°, 165° to 175°, 0°). |

19. The surface acoustic wave device according to claim 17, wherein the normalized film thickness of the IDT electrode is within the range of about 0.06 to about 0.12.

20. The surface acoustic wave device according to claim 17, wherein the normalized film thickness of the SiO$_2$ layer is within the range of about 0.25 to about 0.3.

21. The surface acoustic wave device according to claim 17, wherein an upper surface of the IDT electrode is flush with an upper surface of the LiNbO$_3$ substrate.

22. The surface acoustic wave device according to claim 17, wherein each of the grooves includes a bottom surface and a pair of inner side surfaces extending between the bottom surface and a upper surface of the LiNbO$_3$ substrate, and an internal angle of the grooves, defined by the inner side surfaces and the upper surface of the piezoelectric substrate is within the range of about 45° to about 90°.

23. The surface acoustic wave device according to claim 22, wherein the internal angle of the grooves is within the range of about 50° to about 80°.

24. The surface acoustic wave device according to claim 17, wherein the IDT electrode is provided with a close contact layer composed of Al and a metal or an alloy having a density greater than that of Al.

* * * * *